United States Patent
Kaseyama et al.

(10) Patent No.: US 10,266,701 B2
(45) Date of Patent: Apr. 23, 2019

(54) COMPOSITION FOR FORMING PROTECTIVE FILM FOR TRANSPARENT CONDUCTIVE FILM

(71) Applicant: NISSAN CHEMICAL INDUSTRIES, LTD., Tokyo (JP)

(72) Inventors: Takahiro Kaseyama, Funabashi (JP); Naoya Nishimura, Funabashi (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 61 days.

(21) Appl. No.: 15/105,405

(22) PCT Filed: Dec. 17, 2014

(86) PCT No.: PCT/JP2014/083349
§ 371 (c)(1),
(2) Date: Jun. 16, 2016

(87) PCT Pub. No.: WO2015/093510
PCT Pub. Date: Jun. 25, 2015

(65) Prior Publication Data
US 2016/0319132 A1    Nov. 3, 2016

(30) Foreign Application Priority Data

Dec. 17, 2013  (JP) ................................ 2013-259723

(51) Int. Cl.
| | | |
|---|---|---|
| *C09D 4/00* | (2006.01) | |
| *C08F 2/44* | (2006.01) | |
| *C09D 179/04* | (2006.01) | |
| *C08L 79/04* | (2006.01) | |
| *C08G 73/06* | (2006.01) | |
| *C09D 5/24* | (2006.01) | |
| *C08F 283/00* | (2006.01) | |
| *C09D 11/52* | (2014.01) | |
| *H01L 51/00* | (2006.01) | |
| *C09D 7/40* | (2018.01) | |
| *C09D 7/61* | (2018.01) | |
| *C08F 222/10* | (2006.01) | |
| *H01L 51/52* | (2006.01) | |
| *C08K 3/08* | (2006.01) | |
| *C08K 7/06* | (2006.01) | |

(52) U.S. Cl.
CPC .................. *C09D 4/00* (2013.01); *C08F 2/44* (2013.01); *C08F 283/00* (2013.01); *C08G 73/065* (2013.01); *C08G 73/0644* (2013.01); *C08L 79/04* (2013.01); *C09D 5/24* (2013.01); *C09D 7/40* (2018.01); *C09D 7/61* (2018.01); *C09D 11/52* (2013.01); *C09D 179/04* (2013.01); *H01L 51/0035* (2013.01); *H01L 51/0043* (2013.01); *C08F 222/1006* (2013.01); *C08F 2222/104* (2013.01); *C08F 2222/1013* (2013.01); *C08K 7/06* (2013.01); *C08K 2003/0806* (2013.01); *C08K 2201/001* (2013.01); *C08K 2201/011* (2013.01); *H01L 51/5206* (2013.01); *H01L 51/5221* (2013.01); *H01L 51/5253* (2013.01)

(58) Field of Classification Search
CPC .......... C09D 4/00; C09D 7/12; C09D 179/04; C09D 5/24; C09D 11/52; C08F 2/44; C08F 283/00; C08F 222/1006; C08F 2222/1013; C08F 2222/104; C08L 79/04; C08G 73/0644; C08G 73/065; H01L 51/0035; H01L 51/0043; H01L 51/5253; H01L 51/5206; H01L 51/5221
USPC ...................................................... 428/411.1
See application file for complete search history.

(56) References Cited

U.S. PATENT DOCUMENTS 8,049,333 B2    11/2011  Alden et al.
8,618,243 B2 *  12/2013  Nishimura ......... C08G 73/0273
                                                  257/432
(Continued)

FOREIGN PATENT DOCUMENTS

JP    2001-503077 A    3/2001
JP    2004-047298 A    2/2004
(Continued)

OTHER PUBLICATIONS

Extended European Search Report, dated Jun. 26, 2017, for European Application No. 14871090.8.
(Continued)

*Primary Examiner* — Michael Bernshteyn
(74) *Attorney, Agent, or Firm* — Birch, Stewart, Kolasch & Birch, LLP

(57) ABSTRACT

Provided is a composition for forming a protective film for a transparent conductive film, said composition comprising a triazine ring-containing hyperbranched polymer comprising a repeating unit structure represented by formula (1) and a crosslinking agent having a molecular weight of 1,000 or greater.

(1)

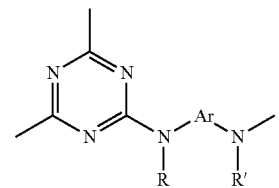

In formula (1): R and R' independently represent a hydrogen atom, an alkyl group, an alkoxy group, an aryl group or an aralkyl group; and Ar represents a definite aromatic ring-containing group.

11 Claims, 2 Drawing Sheets

(56) References Cited

U.S. PATENT DOCUMENTS

| | | | |
|---|---|---|---|
| 9,434,856 B2* | 9/2016 | Nishimura | C08G 73/0644 |
| 9,618,654 B2* | 4/2017 | Nishimura | C08G 73/0273 |
| 2003/0164679 A1* | 9/2003 | Hamano | H01L 51/5271 |
| | | | 313/504 |
| 2012/0049308 A1 | 3/2012 | Nishimura et al. | |
| 2013/0154043 A1* | 6/2013 | Kato | C08G 73/026 |
| | | | 257/432 |
| 2013/0281620 A1 | 10/2013 | Nishimura et al. | |
| 2013/0324634 A1* | 12/2013 | Nishimura | C08F 226/02 |
| | | | 522/144 |
| 2015/0094420 A1* | 4/2015 | Nishimura | C09D 179/04 |
| | | | 524/612 |
| 2015/0115247 A1* | 4/2015 | Nishimura | C08G 73/0273 |
| | | | 257/40 |

FOREIGN PATENT DOCUMENTS

| | | | | |
|---|---|---|---|---|
| JP | 2004047298 A * | 2/2004 | | |
| JP | 2004047298 A * | 2/2004 | | |
| JP | 2004-156001 A | 6/2004 | | |
| JP | 2009-505358 A | 2/2009 | | |
| JP | 2010-108877 A | 5/2010 | | |
| JP | 2012-092261 A | 5/2012 | | |
| JP | 2013-077234 A | 4/2013 | | |
| JP | WO 2013168787 A1 * | 11/2013 | | C09D 179/04 |
| JP | WO 2013168788 A1 * | 11/2013 | | C09D 179/04 |
| WO | WO 2010/128661 A1 | 11/2010 | | |
| WO | WO 2012/029617 A1 | 3/2012 | | |
| WO | WO 2012/060286 A1 | 5/2012 | | |
| WO | WO 2013/168787 A1 | 11/2013 | | |
| WO | WO 2013/168788 A1 | 11/2013 | | |
| WO | WO-2013168787 A1 * | 11/2013 | | C09D 179/04 |
| WO | WO-2013168788 A1 * | 11/2013 | | C09D 179/04 |

OTHER PUBLICATIONS

International Search Report (PCT/ISA/210) issued in PCT/JP2014/083349, dated Feb. 17, 2015.

Written Opinion (PCT/ISA/237) issued in PCT/JP2014/083349, dated Feb. 17, 2015.

* cited by examiner

COMPOSITION FOR FORMING PROTECTIVE FILM FOR TRANSPARENT CONDUCTIVE FILM

TECHNICAL FIELD

This invention relates to a protective film-forming composition for use on a transparent conductive film.

BACKGROUND ART

Transparent conductive film materials in use today are predominantly inorganic oxides such as indium tin oxide (ITO) and indium zinc oxide (IZO). These are standard materials that have good optical clarity and electrical conductivity. However, complex processes such as sputtering and high-vacuum, high-temperature annealing are required to obtain such inorganic oxide films. Hence, there is a need for special equipment, which is costly.

As electronic devices become increasingly flexible and lightweight owing to the use of, for example, plastic substrates, there has arisen a need for durability to physical stress from bending and the like. Although ITO and IZO film-forming technology on flexible substrates is also under investigation, the inherent brittleness and fragility of inorganic oxides have yet to be improved.

In recent years, such progress toward greater flexibility has been accompanied by the development of transparent conductive films having conductive nanostructures (such as metal nanoparticle or metal nanowire percolation structures or metal mesh structures). Using a metal nanoparticle or metal nanowire dispersion, transparent conductive films can be produced by wet processes (Patent Documents 1 to 3).

It is possible to lower the electrical resistance of a transparent conductive film having electrically conductive nanostructures merely by increasing the amount of metal included; that is, without requiring a complex process. However, increasing the amount of metal gives rise to clouding on account of the irregular reflection of light, resulting in a loss of optical clarity. In addition, problems associated with the use of metal include a loss of electrical conductivity due to surface deterioration or breakup of the nanostructures.

PRIOR ART DOCUMENTS

Patent Documents

Patent Document 1: JP-A 2009-505358
Patent Document 2: JP-A 2013-77234
Patent Document 3: JP-A 2010-108877
Patent Document 4: WO 2010/128661

SUMMARY OF THE INVENTION

Problems to be Solved by the Invention

It is therefore an object of this invention to provide a composition that forms a protective film for transparent conductive films, which protective film is able to improve the visibility of a transparent conductive film having conductive nanostructures and moreover has a transparent conductive film degradation-suppressing effect.

Means for Solving the Problems

As a result of extensive investigations, the inventors have discovered that a composition containing a specific triazine ring-containing hyperbranched polymer and a crosslinking agent having a molecular weight of at least 1,000 forms a film which can improve the visibility of a transparent conductive film and has a resistance to elevated temperature and humidity, and is thus suitable as a protective film for a transparent conductive film.

Accordingly, the invention provides the following film-forming composition for use on a transparent conductive film.

1. A film-forming composition for use on a transparent conductive film, the composition being characterized by comprising a triazine ring-containing hyperbranched polymer which includes a recurring unit structure of formula (1) below

[Chemical Formula 1]

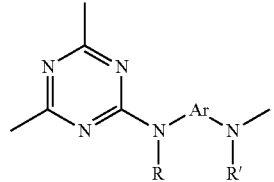

(1)

(wherein R and R' are each independently a hydrogen atom, an alkyl group, an alkoxy group, an aryl group or an aralkyl group; and Ar is at least one moiety selected from the group consisting of moieties of formulas (2) to (13) below

[Chemical Formula 2]

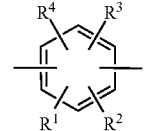

(2)

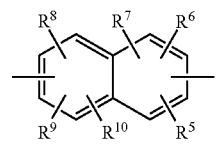

(3)

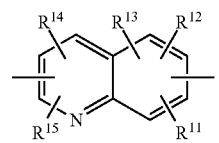

(4)

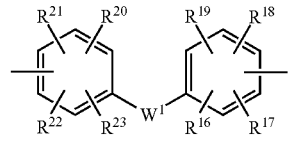

(5)

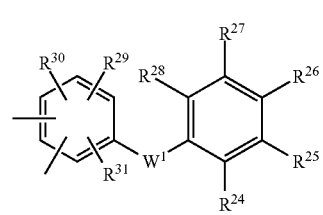

(6)

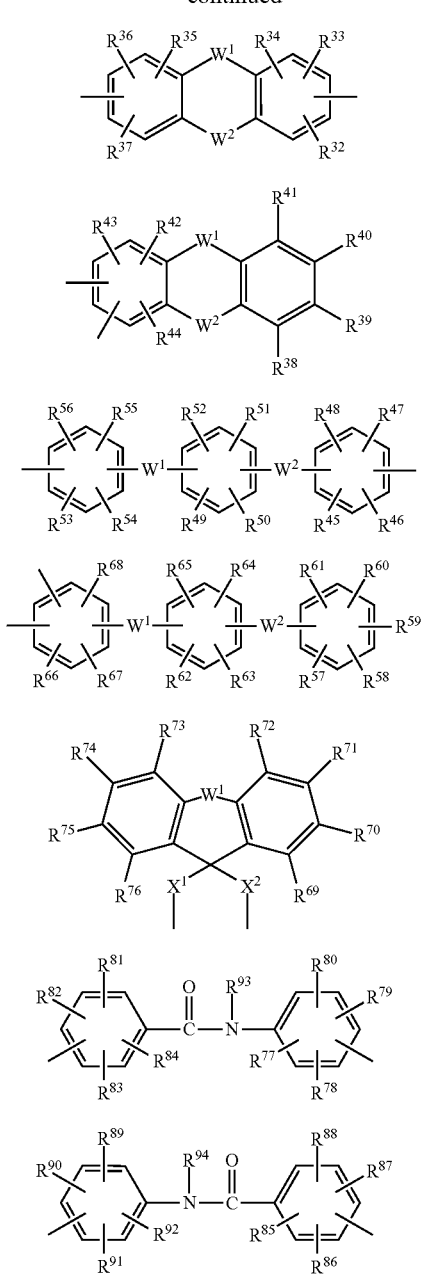

(in which $R^1$ to $R^{92}$ are each independently a hydrogen atom, a halogen atom, a carboxyl group, a sulfo group, an alkyl group of 1 to 10 carbon atoms, or an alkoxy group of 1 to 10 carbon atoms;

$R^{93}$ and $R^{94}$ are hydrogen atoms or alkyl groups of 1 to 10 carbon atoms;

$W^1$ and $W^2$ are each independently a single bond, —C($R^{95}$)($R^{96}$)— ($R^{95}$ and $R^{96}$ being each independently a hydrogen atom or an alkyl group of 1 to 10 carbon atoms, with the proviso that when $R^{95}$ and $R^{96}$ are both alkyl groups, they may mutually bond to form, together with the carbon atom to which they are bonded, a ring), —C(O)—, —O—, —S—, —S(O)—, —S(O)$_2$— or —N(R)$^{97}$— ($R^{97}$ being a hydrogen atom or an alkyl group of 1 to 10 carbon atoms); and $X^1$ and $X^2$ are each independently a single bond, an alkylene group of 1 to 10 carbon atoms, or a group of formula (14) below

[Chemical Formula 3]

(14)

($R^{98}$ to $R^{101}$ being each independently a hydrogen atom, a halogen atom, a carboxyl group, a sulfo group, an alkyl group of 1 to 10 carbon atoms, or an alkoxy group of 1 to 10 carbon atoms; and $Y^1$ and $Y^2$ being each independently a single bond or an alkylene group of 1 to 10 carbon atoms))), and a crosslinking agent A having a molecular weight of at least 1,000.

2. The composition of 1 above, wherein crosslinking agent A is a poly(meth)acrylic compound.

3. The composition of 1 or 2 above which includes from 0.1 to 30 parts by weight of crosslinking agent A per 100 parts by weight of the triazine ring-containing hyperbranched polymer.

4. The composition of any one of 1 to 3 above which further comprises a crosslinking agent B having a molecular weight of less than 1,000.

5. The composition of 4 above, wherein crosslinking agent B is a poly(meth)acrylic compound.

6. The composition of 4 or 5 above which includes from 0.5 to 400 parts by weight of crosslinking agent B per 100 parts by weight of crosslinking agent A.

7. The composition of any one of 1 to 6 above which further comprises a solvent.

8. A protective film for use on a transparent conductive film, which protective film is obtained by curing the composition of any one of 1 to 7 above.

9. The protective film of 8 above, wherein the transparent conductive film is a transparent conductive film having electrically conductive nanostructures.

10. The protective film of 9 above, wherein the electrically conductive nanostructures are made of silver nanowire.

11. A transparent electrode comprising a transparent conductive film and the protective film of 8 above formed on the transparent conductive film.

12. An electronic device comprising a transparent conductive film and the protective film of 8 above formed on the transparent conductive film.

13. The electronic device of 12 above which is an organic electroluminescence display.

Advantageous Effects of the Invention

The protective film formed using the inventive protective film-forming composition for use on a transparent conductive film has a high transparency and a high refractive index, thus enabling the visibility of the transparent conductive film to be improved. In addition, the protective film also has a high heat resistance and a high resistance to elevated temperature and humidity, enabling deterioration of the transparent conductive film to be suppressed. Hence, protective films produced using the inventive composition can be suitably used as protective films for transparent conductive films.

BRIEF DESCRIPTION OF THE DIAGRAMS

EMBODIMENT FOR CARRYING OUT THE INVENTION

[Triazine Ring-Containing Hyperbranched Polymer]

Figure 1:
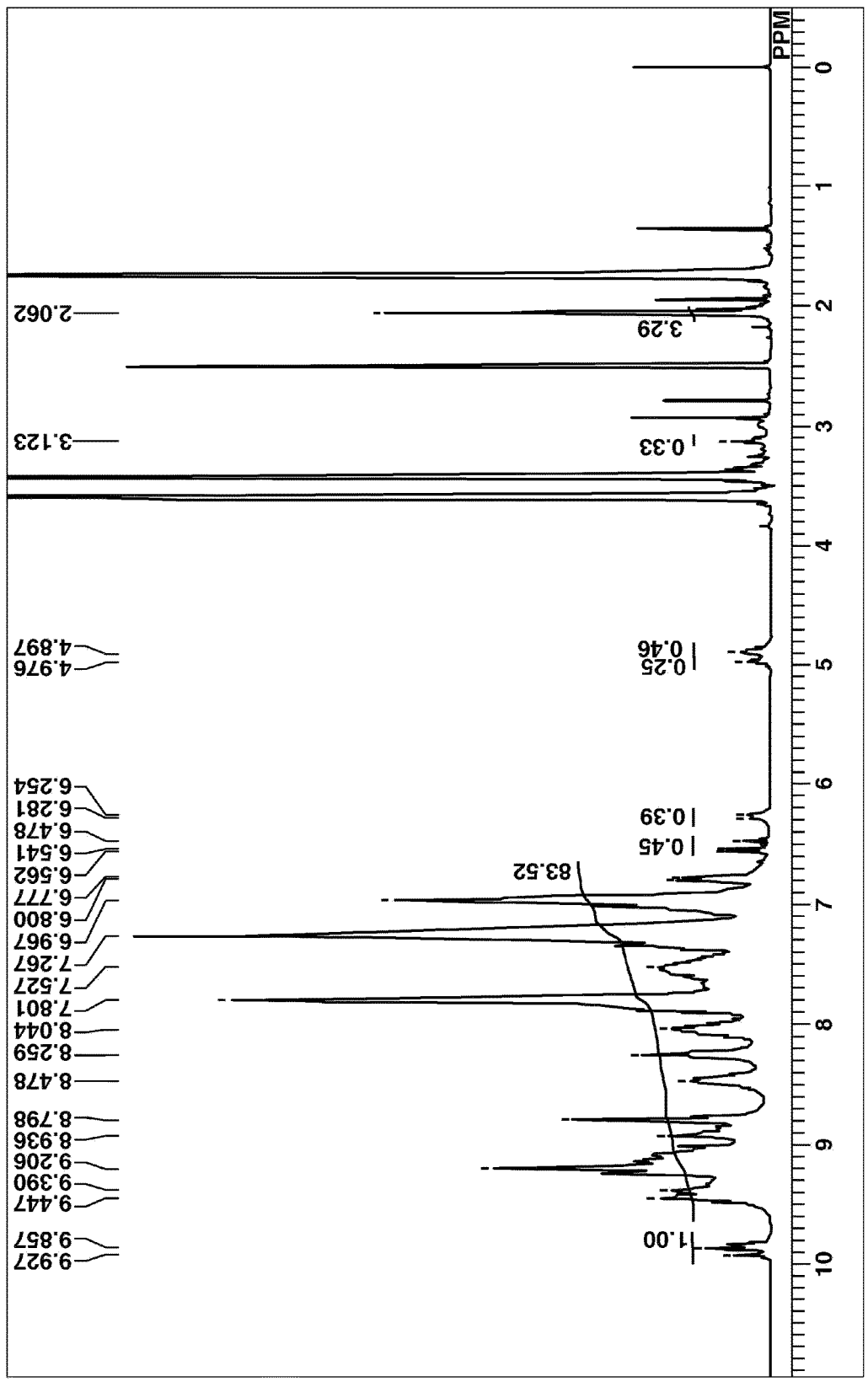
FIG. 1 is an $^1$H-NMR spectrum of HB-TmDA40 obtained in Synthesis Example 1.

The protective film-forming composition for use on a transparent conductive film contains a triazine ring-containing hyperbranched polymer which includes recurring units of formula (1) below.

[Chemical Formula 4]

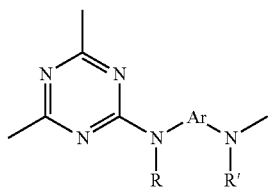

(1)

In this formula, R and R' are each independently a hydrogen atom, an alkyl group, an alkoxy group, an aryl group or an aralkyl group.

The number of carbon atoms on the alkyl group, although not particularly limited, is preferably from 1 to 20. To further increase the heat resistance of the polymer, the number of carbon atoms is more preferably from 1 to 10, and even more preferably from 1 to 3. The alkyl group may have a linear, branched or cyclic structure.

Illustrative examples of alkyl groups include methyl, ethyl, n-propyl, isopropyl, cyclopropyl, n-butyl, isobutyl, s-butyl, t-butyl, cyclobutyl, 1-methylcyclopropyl, 2-methylcyclopropyl, n-pentyl, 1-methyl-n-butyl, 2-methyl-n-butyl, 3-methyl-n-butyl, 1,1-dimethyl-n-propyl, 1,2-dimethyl-n-propyl, 2,2-dimethyl-n-propyl, 1-ethyl-n-propyl, cyclopentyl, 1-methylcyclobutyl, 2-methylcyclobutyl, 3-methylcyclobutyl, 1,2-dimethylcyclopropyl, 2,3-dimethylcyclopropyl, 1-ethylcyclopropyl, 2-ethylcyclopropyl, n-hexyl, 1-methyl-n-pentyl, 2-methyl-n-pentyl, 3-methyl-n-pentyl, 4-methyl-n-pentyl, 1,1-dimethyl-n-butyl, 1,2-dimethyl-n-butyl, 1,3-dimethyl-n-butyl, 2,2-dimethyl-n-butyl, 2,3-dimethyl-n-butyl, 3,3-dimethyl-n-butyl, 1-ethyl-n-butyl, 2-ethyl-n-butyl, 1,1,2-trimethyl-n-propyl, 1,2,2-trimethyl-n-propyl, 1-ethyl-1-methyl-n-propyl, 1-ethyl-2-methyl-n-propyl, cyclohexyl, 1-methylcyclopentyl, 2-methylcyclopentyl, 3-methylcyclopentyl, 1-ethylcyclobutyl, 2-ethylcyclobutyl, 3-ethylcyclobutyl, 1,2-dimethylcyclobutyl, 1,3-dimethylcyclobutyl, 2,2-dimethylcyclobutyl, 2,3-dimethylcyclobutyl, 2,4-dimethylcyclobutyl, 3,3-dimethylcyclobutyl, 1-n-propylcyclopropyl, 2-n-propylcyclopropyl, 1-isopropylcyclopropyl, 2-isopropylcyclopropyl, 1,2,2-trimethylcyclopropyl, 1,2,3-trimethylcyclopropyl, 2,2,3-trimethylcyclopropyl, 1-ethyl-2-methylcyclopropyl, 2-ethyl-1-methylcyclopropyl, 2-ethyl-2-methylcyclopropyl and 2-ethyl-3-methylcyclopropyl groups.

The number of carbon atoms on the alkoxy group, although not particularly limited, is preferably from 1 to 20. To further increase the heat resistance of the polymer, the number of carbon atoms is more preferably from 1 to 10, and even more preferably from 1 to 3. The alkyl moiety thereon may have a linear, branched or cyclic structure.

Illustrative examples of alkoxy groups include methoxy, ethoxy, n-propoxy, isopropoxy, n-butoxy, isobutoxy, s-butoxy, t-butoxy, n-pentoxy, 1-methyl-n-butoxy, 2-methyl-n-butoxy, 3-methyl-n-butoxy, 1,1-dimethyl-n-propoxy, 1,2-dimethyl-n-propoxy, 2,2-dimethyl-n-propoxy, 1-ethyl-n-propoxy, n-hexyloxy, 1-methyl-n-pentyloxy, 2-methyl-n-pentyloxy, 3-methyl-n-pentyloxy, 4-methyl-n-pentyloxy, 1,1-dimethyl-n-butoxy, 1,2-dimethyl-n-butoxy, 1,3-dimethyl-n-butoxy, 2,2-dimethyl-n-butoxy, 2,3-dimethyl-n-butoxy, 3,3-dimethyl-n-butoxy, 1-ethyl-n-butoxy, 2-ethyl-n-butoxy, 1,1,2-trimethyl-n-propoxy, 1,2,2-trimethyl-n-propoxy, 1-ethyl-1-methyl-n-propoxy and 1-ethyl-2-methyl-n-propoxy groups.

The number of carbon atoms on the aryl group, although not particularly limited, is preferably from 6 to 40. To further increase the heat resistance of the polymer, the number of carbon atoms is more preferably from 6 to 16, and even more preferably from 6 to 13. Illustrative examples of aryl groups include phenyl, α-naphthyl, β-naphthyl, 1-anthryl, 2-anthryl, 9-anthryl, 1-phenanthryl, 2-phenanthryl, 3-phenanthryl, 4-phenanthryl and 9-phenanthryl groups.

Some or all of the hydrogen atoms on the aryl group may be substituted with, for example, halogen atoms such as fluorine, chlorine, bromine or iodine, alkyl groups of 1 to 10 carbon atoms, alkoxy groups of 1 to 10 carbon atoms, nitro groups, cyano groups, or phenyl groups. Illustrative examples of substituted aryl groups include o-chlorophenyl, m-chlorophenyl, p-chlorophenyl, o-fluorophenyl, p-fluorophenyl, o-methoxyphenyl, p-methoxyphenyl, p-nitrophenyl, p-cyanophenyl, o-biphenylyl, m-biphenylyl and p-biphenylyl groups.

The number of carbon atoms on the aralkyl group, although not particularly limited, is preferably from 7 to 20, more preferably from 7 to 17, and even more preferably from 7 to 14. The alkylene moiety thereon may be linear, branched or cyclic. Illustrative examples of aralkyl groups include benzyl, phenethyl and 1-naphthylmethyl groups.

Some or all of the hydrogen atoms on the aralkyl group may be substituted with, for example, halogen atoms such as fluorine, chlorine, bromine or iodine, alkyl groups of 1 to 10 carbon atoms, alkoxy groups of 1 to 10 carbon atoms, nitro groups, cyano groups, or phenyl groups. Illustrative examples of substituted aralkyl groups include p-methylphenylmethyl, m-methylphenylmethyl, o-ethylphenylmethyl, m-ethylphenylmethyl, p-ethylphenylmethyl, 2-propylphenylmethyl, 4-isopropylphenylmethyl and 4-isobutylphenylmethyl groups.

In the above formula, Ar is at least one moiety selected from among those of formulas (2) to (13) below.

[Chemical Formula 5]

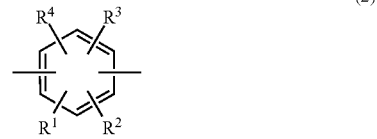

(2)

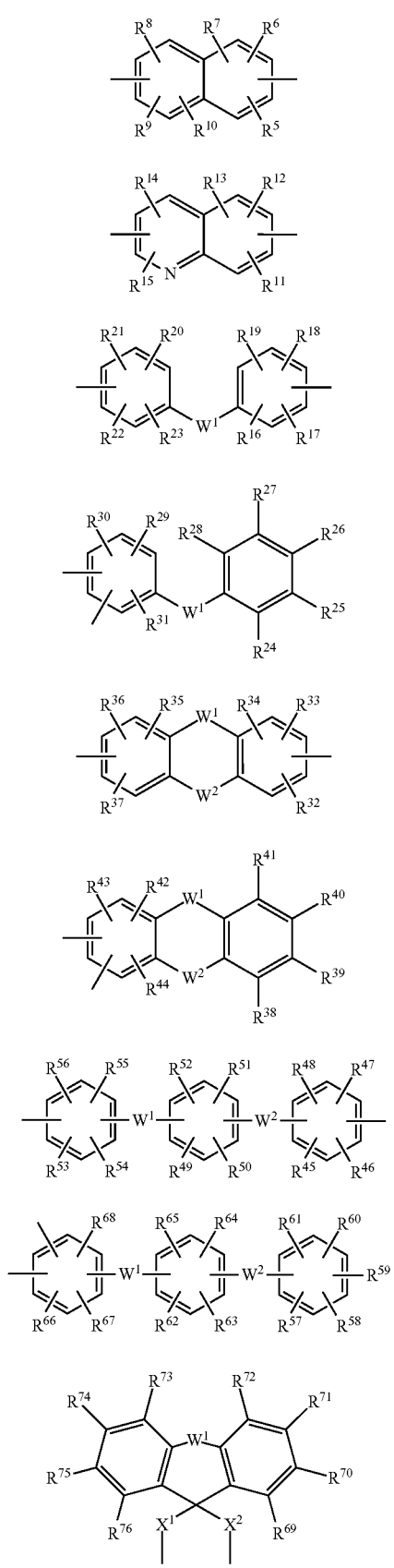

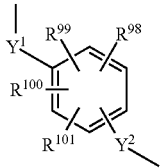

In the above formulas, $R^1$ to $R^{92}$ are each independently a hydrogen atom, a halogen atom, a carboxyl group, a sulfo group, an alkyl group of 1 to 10 carbon atoms, or an alkoxy group of 1 to 10 carbon atoms.

$R^{93}$ and $R^{94}$ are hydrogen atoms or alkyl groups of 1 to 10 carbon atoms.

$W^1$ and $W^2$ are each independently a single bond, —C($R^{95}$)($R^{96}$)— ($R^{95}$ and $R^{96}$ being each independently a hydrogen atom or an alkyl group of 1 to 10 carbon atoms, with the proviso that when $R^{95}$ and $R^{96}$ are both alkyl groups, they may mutually bond to form, together with the carbon atom to which they are bonded, a ring), —C(O)—, —O—, —S—, —S(O)—, —S(O)$_2$— or —N(R)$^{97}$— ($R^{97}$ being a hydrogen atom or an alkyl group of 1 to 10 carbon atoms).

$X^1$ and $X^2$ are each independently a single bond, an alkylene group of 1 to 10 carbon atoms, or a group of formula (14) below.

[Chemical Formula 6]

(14)

In the formula, $R^{98}$ to $R^{101}$ are each independently a hydrogen atom, a halogen atom, a carboxyl group, a sulfo group, an alkyl group of 1 to 10 carbon atoms, or an alkoxy group of 1 to 10 carbon atoms. $Y^1$ and $Y^2$ are each independently a single bond or an alkylene group of 1 to 10 carbon atoms.

Halogen atoms represented by $R^1$ to $R^{101}$ are exemplified by fluorine, chlorine, bromine and iodine atoms. Alkyl groups and alkoxy groups represented by $R^1$ to $R^{101}$ are exemplified by the same alkyl and alkoxy groups as those mentioned above for R and R', with linear or branched groups being especially preferred.

Alkylene groups of 1 to 10 carbon atoms are exemplified by groups obtained by removing one hydrogen atom from the alkyl groups mentioned above for R and R', with linear or branched groups being especially preferred. Illustrative examples include methylene, ethylene, propylene, trimethylene, tetramethylene and pentamethylene groups.

In particular, Ar is preferably a group of formula (2) or (5) to (13), and more preferably a group of formula (2), (5), (7), (8) or (11) to (13). Illustrative examples of groups of formulas (2) to (13) include, but are not limited to, those of the following formulas.
[Chemical Formula 7]
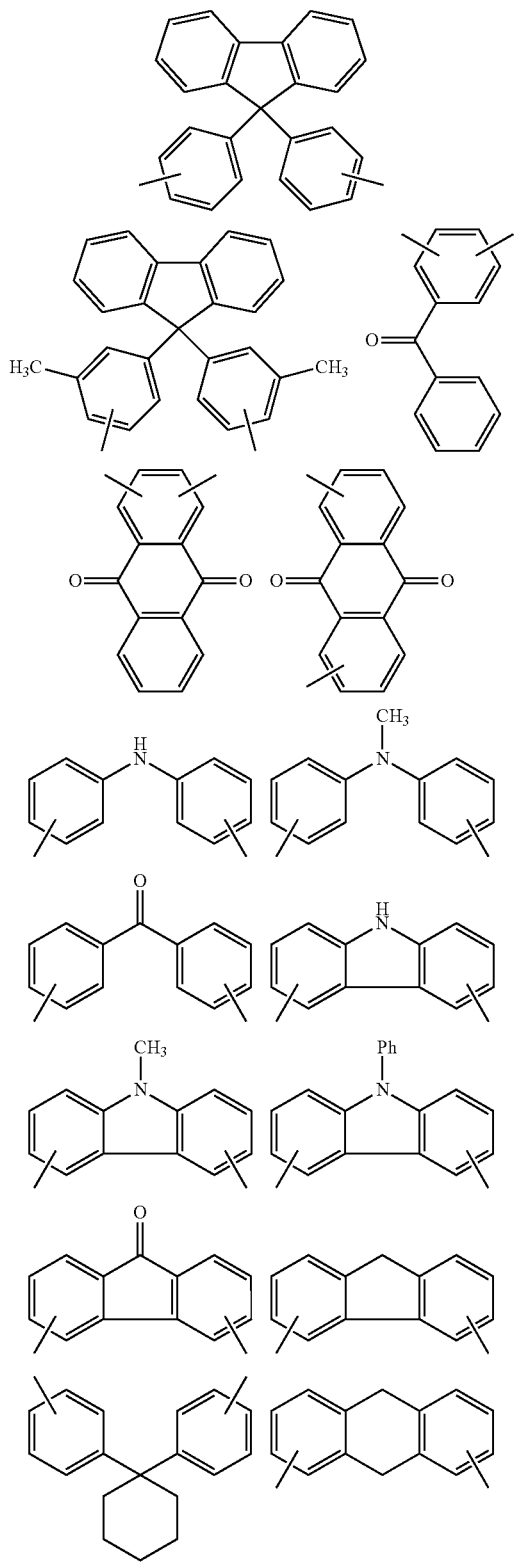
-continued
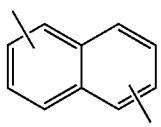
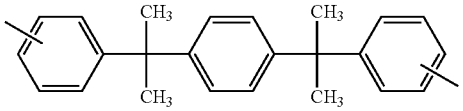
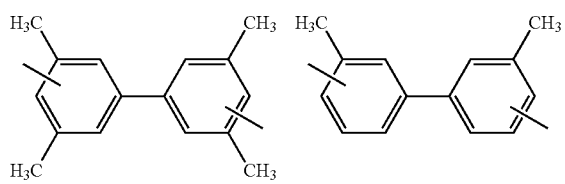
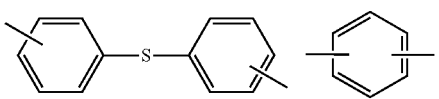
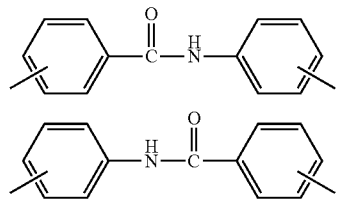
Of these, to obtain a polymer having a higher refractive index, groups of the following formulas are more preferred.
[Chemical Formula 8]
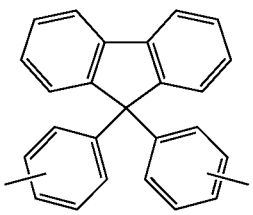
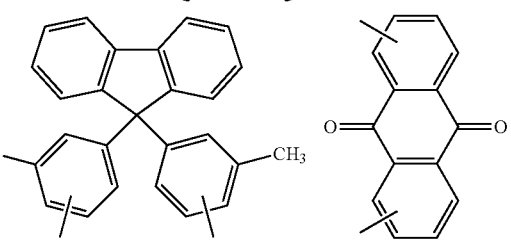
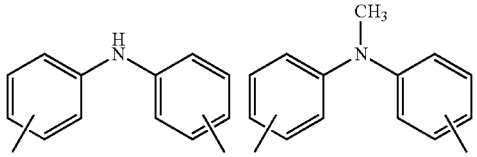
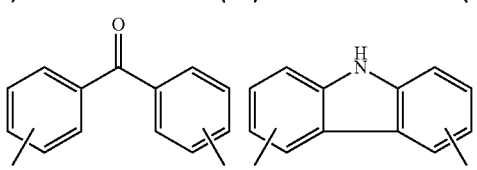

-continued

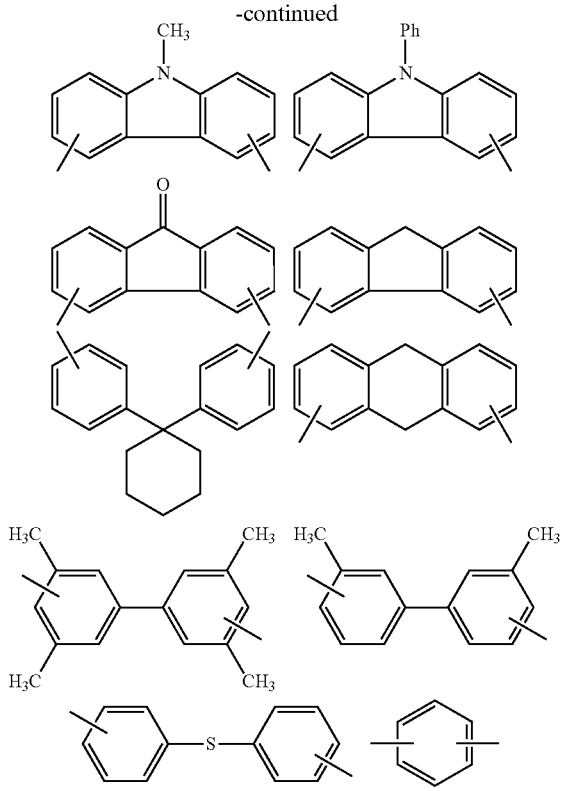

Taking into account particularly the solubility in organic solvents and the like, it is preferable for the hyperbranched polymer used in this invention to include recurring units of formula (15).

[Chemical Formula 9]

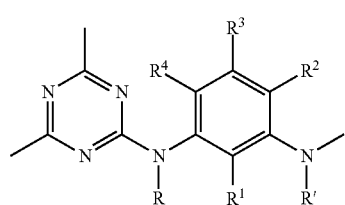

(15)

In this formula, R, R' and $R^1$ to $R^4$ are as defined above.

From this standpoint, especially preferred recurring unit structures include those of formula (16) below, with hyperbranched polymers of formula (17) below being most preferred.

[Chemical Formula 10]

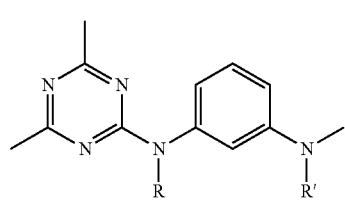

(16)

In this formula, R and R' are as defined above.

[Chemical Formula 11]

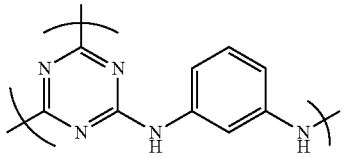

(17)

The hyperbranched polymer used in this invention has a weight-average molecular weight (Mw) which, although not particularly limited, is preferably between 500 and 500,000, and more preferably between 1,000 and 100,000. To further enhance the heat resistance and lower the shrinkage ratio, the Mw lower limit is preferably 2,000. To further increase the solubility and lower the viscosity of the resulting solution, the upper limit is preferably 50,000, more preferably 30,000, and even more preferably 10,000. In this invention, the weight-average molecular weight is a value measured by gel permeation chromatography (GPC) against a polystyrene standard.

[Method of Producing Triazine Ring-Containing Hyperbranched Polymer]

The triazine ring-containing hyperbranched polymer used in this invention may be prepared by the method disclosed in above-cited Patent Document 4.

For example, as shown in Scheme 1 below, a hyperbranched polymer (20) can be obtained by reacting a cyanuric halide (18) with an m-phenylenediamine compound (19) in a suitable organic solvent.

Scheme 1

[Chemical Formula 12]

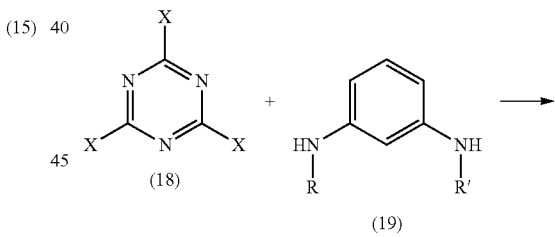

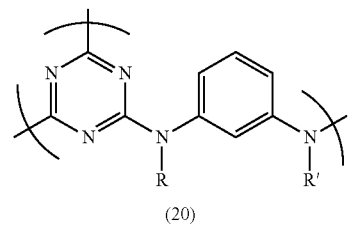

(20)

In the above formula, R and R' are as defined above. Each X is independently a halogen atom.

As shown in Scheme 2 below, a hyperbranched polymer (20) can be synthesized from a compound (20') obtained by reacting equimolar amounts of a cyanuric halide (18) and an m-phenylenediamine compound (19) in a suitable organic solvent.

Scheme 2

[Chemical Formula 13]

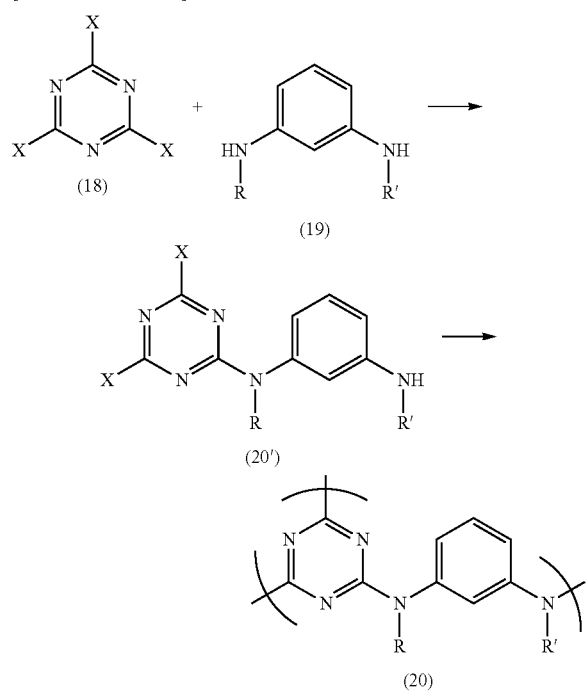

In the above formula, R, R' and X are as defined above.

In the methods of Schemes 1 and 2, the respective starting materials may be charged in any suitable amounts so long as the target polymer is obtained, although the use of from 0.01 to 10 equivalents of the diamine compound (19) per equivalent of the cyanuric halide (18) is preferred. However, in the method of Scheme 1, it is preferable to avoid using 3 equivalents of the diamine compound (19) per 2 equivalents of the cyanuric halide (18). By including the respective functional groups in amounts that are not chemically equivalent, the formation of a gel can be prevented.

To obtain hyperbranched polymers of various molecular weights which have many terminal triazine rings, it is preferable to use the diamine compound (19) in an amount of less than 3 equivalents per 2 equivalents of the cyanuric halide (18). For example, in cases where a thin film has been produced, in order for the film to have an excellent transparency and light resistance, a hyperbranched polymer having many terminal triazine rings is preferred.

On the other hand, to obtain hyperbranched polymers of various molecular weights which have many terminal amines, it is preferable to use the cyanuric halide (18) in an amount of less than 2 equivalents per 3 equivalents of the diamine compound (19).

The molecular weight of the resulting hyperbranched polymer can be easily adjusted by suitable adjustment of the amounts of the diamine compound (19) and the cyanuric halide (18) in this way.

Various solvents that are commonly used in this type of reaction may be used as the organic solvent. Illustrative examples include tetrahydrofuran, dioxane, dimethylsulfoxide; amide solvents such as N,N-dimethylformamide, N-methyl-2-pyrrolidone, tetramethylurea, hexamethylphosphoramide, N,N-dimethylacetamide, N-methyl-2-piperidone, N,N-dimethylethyleneurea, N,N,N',N'-tetramethylmalonamide, N-methylcaprolactam, N-acetylpyrrolidine, N,N-diethylacetamide, N-ethyl-2-pyrrolidone, N,N-dimethylpropionamide, N,N-dimethylisobutyramide, N-methylformamide and N,N'-dimethylpropyleneurea; and mixed solvents thereof.

Of the above, N,N-dimethylformamide, dimethylsulfoxide, N-methyl-2-pyrrolidone, N,N-dimethylacetamide, and mixed solvents thereof are preferred. N,N-Dimethylacetamide and N-methyl-2-pyrrolidone are especially preferred.

In the Scheme 1 reaction and the second stage reaction in Scheme 2, the reaction temperature may be suitably set in the range from the melting point to the boiling point of the solvent used, although the temperature is preferably from about 0° C. to about 150° C., and more preferably from 60° C. to 100° C. In the Scheme 1 reaction in particular, to suppress linearity and increase the degree of branching, the reaction temperature is preferably from 60° C. to 150° C., more preferably from 80° C. to 150° C., and even more preferably from 80° C. to 120° C.

In the first stage reaction of Scheme 2, the reaction temperature may be suitably set in the range from the melting point to the boiling point of the solvent used, with a temperature of from about −50° C. to about 50° C. being preferred, a temperature of from about −20° C. to about 50° C. being more preferred, a temperature of from about −10° C. to about 50° C. being even more preferred, and a temperature of from −10° C. to 10° C. being still more preferred. In the Scheme 2 method in particular, the use of a two-stage process consisting of a first step involving reaction at from −50° C. to 50° C., followed by a second step involving reaction at from 60° C. to 150° C. is preferred.

In each of the above reactions, the ingredients may be added in any order. However, in the Scheme 1 reaction, the best method is to heat a solution containing either the cyanuric halide (18) or the diamine compound (19) and the organic solvent to a temperature of from 60° C. to 150° C., and preferably from 80° C. to 150° C., then add the remaining ingredient—the diamine compound (19) or the cyanuric halide (18)—to the resulting solution at this temperature.

In this case, either ingredient may be used as the ingredient which is initially dissolved in the solvent or as the ingredient which is subsequently added, although a method wherein the cyanuric halide (18) is added to a heated solution of the diamine compound (19) is preferred.

In the Scheme 2 reactions, either ingredient may be used as the ingredient which is initially dissolved in the solvent or as the ingredient which is subsequently added, although a method wherein the diamine compound (19) is added to a cooled solution of the cyanuric halide (18) is preferred. The subsequently added ingredient may be added neat or may be added as a solution of the ingredient dissolved in an organic solvent such as any of those mentioned above. However, taking into account the ease of operation and the controllability of the reaction, the latter approach is preferred. Also, addition of the subsequently added ingredient may be carried out gradually such as in a dropwise manner, or the entire amount may be added all at once in a batchwise manner.

In Scheme 1, even when the reaction is carried out in a single stage after both compounds have been mixed together in a heated state (that is, without raising the temperature stepwise), the desired triazine ring-containing hyperbranched polymer can be obtained without gelation.

In the Scheme 1 reaction and the second stage reaction in Scheme 2, various bases which are commonly used during or after polymerization may be added. Illustrative examples of such bases include potassium carbonate, potassium hydroxide, sodium carbonate, sodium hydroxide, sodium bicarbonate, sodium ethoxide, sodium acetate, lithium carbonate, lithium hydroxide, lithium oxide, potassium acetate, magnesium oxide, calcium oxide, barium hydroxide, trilithium phosphate, trisodium phosphate, tripotassium phosphate, cesium fluoride, aluminum oxide, ammonia, trimethylamine, triethylamine, diisopropylamine, diisopropylethylamine, N-methylpiperidine, 2,2,6,6-tetramethyl-N-methylpiperidine, pyridine, 4-dimethylaminopyridine and N-methylmorpholine.

The amount of base added per equivalent of the cyanuric halide (18) is preferably from 1 to 100 equivalents, and more preferably from 1 to 10 equivalents. These bases may be used in the form of an aqueous solution.

In the methods of both schemes, following reaction completion, the product can be easily purified by a suitable technique such as re-precipitation.

Also, in the present invention, some portion of the halogen atoms on at least one terminal triazine ring may be capped with, for example, alkyl groups, aralkyl groups, aryl groups, alkylamino groups, alkoxysilyl-containing alkylamino groups, aralkylamino groups, arylamino groups, alkoxy groups, aralkyloxy groups, aryloxy groups or ester groups.

Of these, alkylamino groups, alkoxysilyl-containing alkylamino groups, aralkylamino groups and arylamino groups are preferred. Alkylamino groups and arylamino groups are more preferred. Arylamino groups are even more preferred.

The above alkyl groups, alkoxy groups, aryl groups and aralkyl groups are exemplified by the same groups as mentioned above for R and R'.

Illustrative examples of ester groups include methoxycarbonyl and ethoxycarbonyl groups.

Illustrative examples of alkylamino groups include methylamino, ethylamino, n-propylamino, isopropylamino, n-butylamino, isobutylamino, s-butylamino, t-butylamino, n-pentylamino, 1-methyl-n-butylamino, 2-methyl-n-butylamino, 3-methyl-n-butylamino, 1,1-dimethyl-n-propylamino, 1,2-dimethyl-n-propylamino, 2,2-dimethyl-n-propylamino, 1-ethyl-n-propylamino, n-hexylamino, 1-methyl-n-pentylamino, 2-methyl-n-pentylamino, 3-methyl-n-pentylamino, 4-methyl-n-pentylamino, 1,1-dimethyl-n-butylamino, 1,2-dimethyl-n-butylamino, 1,3-dimethyl-n-butylamino, 2,2-dimethyl-n-butylamino, 2,3-dimethyl-n-butylamino, 3,3-dimethyl-n-butylamino, 1-ethyl-n-butylamino, 2-ethyl-n-butylamino, 1,1,2-trimethyl-n-propylamino, 1,2,2-trimethyl-n-propylamino, 1-ethyl-1-methyl-n-propylamino and 1-ethyl-2-methyl-n-propylamino groups.

Illustrative examples of aralkylamino groups include benzylamino, methoxycarbonylphenylmethylamino, ethoxycarbonylphenylmethylamino, p-methylphenylmethylamino, m-methylphenylmethylamino, o-ethylphenylmethylamino, m-ethylphenylmethylamino, p-ethylphenylmethylamino, 2-propylphenylmethylamino, 4-isopropylphenylmethylamino, 4-isobutylphenylmethylamino, naphthylmethylamino, methoxycarbonylnaphthylmethylamino and ethoxycarbonylnaphthylmethylamino groups.

Illustrative examples of arylamino groups include phenylamino, methoxycarbonylphenylamino, ethoxycarbonylphenylamino, naphthylamino, methoxycarbonylnaphthylamino, ethoxycarbonylnaphthylamino, anthranylamino, pyrenylamino, biphenylamino, terphenylamino and fluorenylamino groups.

Alkoxysilyl-containing alkylamino groups are exemplified by monoalkoxysilyl-containing alkylamino groups, dialkoxysilyl-containing alkylamino groups and trialkoxysilyl-containing alkylamino groups. Illustrative examples include 3-trimethoxysilylpropylamino, 3-triethoxysilylpropylamino, 3-dimethylethoxysilylpropylamino, 3-methyldiethoxysilylpropylamino, N-(2-aminoethyl)-3-dimethylmethoxysilylpropylamino, N-(2-aminoethyl)-3-methyldimethoxysilylpropylamino and N-(2-aminoethyl)-3-trimethoxysilylpropylamino groups.

Illustrative examples of aryloxy groups include phenoxy, naphthoxy, anthranyloxy, pyrenyloxy, biphenyloxy, terphenyloxy and fluorenyloxy groups.

Illustrative examples of aralkyloxy groups include benzyloxy, p-methylphenylmethyloxy, m-methylphenylmethyloxy, o-ethylphenylmethyloxy, m-ethylphenylmethyloxy, p-ethylphenylmethyloxy, 2-propylphenylmethyloxy, 4-isopropylphenylmethyloxy, 4-isobutylphenylmethyloxy and α-naphthylmethyloxy groups.

These groups can be easily introduced by replacing a halogen atom on a triazine ring with a compound that furnishes the corresponding substituent. For example, as shown in Scheme 3 below, by adding an aniline derivative and inducing a reaction, a hyperbranched polymer (21) having a phenylamino group on at least one end is obtained.

Scheme 3

[Chemical Formula 14]

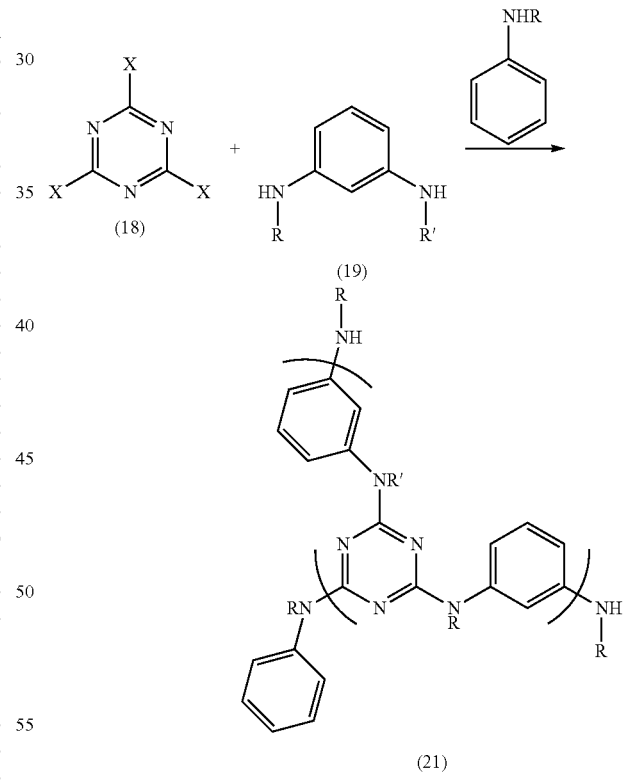

In these formulas, R, R' and X are as defined above.

An organic monoamine is concurrently charged at this time. That is, by reacting the cyanuric halide with a diaminoaryl compound in the presence of an organic monoamine, it is possible to obtain a flexible hyperbranched polymer having a low degree of branching in which the rigidity typical of hyperbranched polymers has been diminished. The hyperbranched polymer obtained in this way has an excellent solubility in a solvent (meaning that agglomeration is inhibited) and has an excellent crosslinkability with a crosslinking agent, thus making it particularly advantageous when used as a composition in combination with the subsequently described crosslinking agent.

An alkyl monoamine, aralkyl monoamine or aryl monoamine may be used here as the organic monoamine.

Illustrative examples of alkyl monoamines include methylamine, ethylamine, n-propylamine, isopropylamine, n-butylamine, isobutylamine, s-butylamine, t-butylamine, n-pentylamine, 1-methyl-n-butylamine, 2-methyl-n-butylamine, 3-methyl-n-butylamine, 1,1-dimethyl-n-propylamine, 1,2-dimethyl-n-propylamine, 2,2-dimethyl-n-propylamine, 1-ethyl-n-propylamine, n-hexylamine, 1-methyl-n-pentylamine, 2-methyl-n-pentylamine, 3-methyl-n-pentylamine, 4-methyl-n-pentylamine, 1,1-dimethyl-n-butylamine, 1,2-dimethyl-n-butylamine, 1,3-dimethyl-n-butylamine, 2,2-dimethyl-n-butylamine, 2,3-dimethyl-n-butylamine, 3,3-dimethyl-n-butylamine, 1-ethyl-n-butylamine, 2-ethyl-n-butylamine, 1,1,2-trimethyl-n-propylamine, 1,2,2-trimethyl-n-propylamine, 1-ethyl-1-methyl-n-propylamine, 1-ethyl-2-methyl-n-propylamine and 2-ethylhexylamine.

Illustrative examples of aralkyl monoamines include benzylamine, p-methoxycarbonylbenzylamine, p-ethoxycarbonylphenylbenzyl, p-methylbenzylamine, m-methylbenzylamine and o-methoxybenzylamine.

Illustrative examples of aryl monoamines include aniline, p-methoxycarbonylaniline, p-ethoxycarbonylaniline, p-methoxyaniline, 1-naphthylamine, 2-naphthylamine, anthranylamine, 1-aminopyrene, 4-biphenylylamine, o-phenylaniline, 4-amino-p-terphenyl and 2-aminofluorene.

In this case, the amount of organic monoamine used per equivalent of the cyanuric halide is set to preferably from 0.05 to 500 equivalents, more preferably 0.05 to 120 equivalents, and even more preferably 0.05 to 50 equivalents.

To suppress linearity and increase the degree of branching, the reaction temperature in this case is preferably from 60 to 150° C., more preferably 80 to 150° C., and even more preferably 80 to 120° C. However, mixing of the three ingredients—an organic monoamine, a cyanuric halide and a diaminoaryl compound—may be carried out at a low temperature, in which case the temperature is set to preferably from about −50° C. to about 50° C., more preferably from about −20° C. to about 50° C., and even more preferably from −20° C. to 10° C. After low-temperature charging, it is preferable to raise the temperature without interruption (i.e., in a single step) to the polymerization temperature and carry out the reaction.

Alternatively, the mixing of two ingredients—a cyanuric halide and a diaminoaryl compound—may be carried out at a low temperature, in which case the temperature is set to preferably from about −50° C. to about 50° C., more preferably from about −20° C. to about 50° C., and even more preferably from −20° C. to 10° C. After low-temperature charging, it is preferable to add the organic monoamine, raise the temperature without interruption (i.e., in a single step) to the polymerization temperature and carry out the reaction. The reaction of the cyanuric halide with the diaminoaryl compound in the presence of such an organic monoamine may be carried out using an organic solvent like any of those mentioned above.

[Crosslinking Agent]

The composition of the invention includes a crosslinking agent A having a molecular weight of at least 1,000. This makes it possible to increase the density of the protective film and enhance the resistance to elevated temperature and humidity.

The inventive composition preferably includes also a crosslinking agent B having a molecular weight of less than 1,000. By adding crosslinking agent B, the density of the protective film can be further increased and the resistance to elevated temperature and humidity can be further enhanced. Crosslinking agent B is more preferably one having a molecular weight of 900 or less, and even more preferably one having a molecular weight of 800 or less.

Crosslinking agents A and B are exemplified by melamine compounds having a crosslink-forming group such as a methylol group or a methoxymethyl group, substituted urea compounds, compounds having a crosslink-forming group such as an epoxy group or an oxetane group, compounds having a blocked isocyanate group, compounds having an acid anhydride group, compounds having a (meth)acryloyl group, aminoplast compounds and phenoplast compounds. Of these, from the standpoint of heat resistance and storage stability, compounds having an epoxy group, a blocked isocyanate group or a (meth)acryl group are preferred. Compounds having a blocked isocyanate group, and polyepoxy compounds and/or poly(meth)acrylic compounds which provide compositions that are photocurable even without the use of an initiator are especially preferred.

These polyfunctional compounds must have at least two crosslink-forming groups, and preferably have three or more crosslink-forming groups.

The polyepoxy compounds are not particularly limited, provided they have two or more epoxy groups per molecule. Illustrative examples include tris(2,3-epoxypropyl) isocyanurate, 1,4-butanediol diglycidyl ether, 1,2-epoxy-4-(epoxyethyl)cyclohexane, glycerol triglycidyl ether, diethylene glycol diglycidyl ether, 2,6-diglycidylphenyl glycidyl ether, 1,1,3-tris[p-(2,3-epoxypropoxy)phenyl]propane, 1,2-cyclohexanedicarboxylic acid diglycidyl ester, 4,4'-methylenebis(N,N-diglycidylaniline), 3,4-epoxycyclohexylmethyl-3,4-epoxycyclohexane carboxylate, trimethylolethane triglycidyl ether, bisphenol A diglycidyl ether and pentaerythritol polyglycidyl ether.

Examples of commercial products that may be used include epoxy resins having at least two epoxy groups, such as YH-434 and YH-434L (from Nippon Steel & Sumikin Chemical Co., Ltd.); epoxy resins having a cyclohexene oxide structure, such as Epolead GT-401, GT-403, GT-301 and GT-302, and also Celloxide 2021 and Celloxide 3000 (all from Daicel Chemical Industries, Ltd.); bisphenol A-type epoxy resins such as jER® 1001, 1002, 1003, 1004, 1007, 1009, 1010 and 828 (all from Mitsubishi Chemical Corporation); bisphenol F-type epoxy resins such as jER® 807 (Mitsubishi Chemical Corporation); phenol-novolak type epoxy resins such as jER® 152 and 154 (Mitsubishi Chemical Corporation), and EPPN 201 and 202 (Nippon Kayaku Co., Ltd.); cresol-novolak type epoxy resins such as EOCN-102, EOCN-103S, EOCN-104S, EOCN-1020, EOCN-1025 and EOCN-1027 (Nippon Kayaku Co., Ltd.), and jER® 180S75 (Mitsubishi Chemical Corporation); alicyclic epoxy resins such as Denacol EX-252 (Nagase ChemteX Corporation), and Araldite® CY175, CY177, CY179, CY-182, CY-192 and CY-184 (Huntsman Advanced Materials), Epiclon 200 and 400 (DIC Corporation), jER® 871 and 872 (Mitsubishi Chemical Corporation), and ED-5661 and ED-5662 (Celanese Coating KK); and aliphatic polyglycidyl ethers such as Denacol EX-611, EX-612, EX-614, EX-622, EX-411, EX-512, EX-522, EX-421, EX-313, EX-314 and EX-321 (Nagase ChemteX Corporation).

The poly(meth)acrylic compounds are not particularly limited, provided they have two or more (meth)acryl groups per molecule. Illustrative examples include ethylene glycol di(meth)acrylate, polyethylene glycol di(meth)acrylate, ethoxylated bisphenol A di(meth)acrylate, ethoxylated trimethylolpropane tri(meth)acrylate, ethoxylated glycerol tri(meth)acrylate, ethoxylated pentaerythritol tetra(meth)acrylate, ethoxylated dipentaerythritol hexa(meth)acrylate, ethoxylated isocyanurate tri(meth)acrylate, tris(2-(meth)acryloyloxyethyl) isocyanurate, ε-caprolactone-modified tris-(2-(meth)acryloxyethyl) isocyanurate, polyglycerol monoethylene oxide poly(meth)acrylate, polyglycerol polyethylene glycol poly(meth)acrylate, dipentaerythritol hexa(meth)acrylate, neopentyl glycol di(meth)acrylate, pentaerythritol tri(meth)acrylate, trimethylolpropane tri(meth)acrylate, tricyclodecane dimethanol di(meth)acrylate, and 1,6-hexanediol di(meth)acrylate.

The poly(meth)acrylic compound may be acquired as a commercial product, illustrative examples of which include NK Ester A-200, A-400, A-600, A-1000, A-9300, A-9300-1CL, A-TMPT, A-TMM-3, A-TMM-3L, A-TMP, A-TMMT, A-DPH, UA-53H, 1G, 2G, 3G, 4G, 9G, 14G, 23G, ABE-300, A-BPE-4, A-BPE-6, A-BPE-10, A-BPE-20, A-BPE-30, BPE-80N, BPE-100N, BPE-200, BPE-500, BPE-900, BPE-1300N, A-GLY-3E, A-GLY-9E, A-GLY-20E, A-TMPT-3EO, A-TMPT-9EO, ATM-4E, ATM-35E and ATM-20E (all from Shin-Nakamura Chemical Co., Ltd.); KAYARAD® DPEA-12, PEG400DA, THE-330 and RP-1040 (all from Nippon Kayaku Co., Ltd.); Aronix® M-210, M-303, M-305, M-306, M-309, M-306, M-310, M-313, M-315, M-321, M-350, M-360, M-400, M-402, M-403, M-404, M-405, M-406, M-408, M-450, M-452 and M-460 (from Toagosei Co., Ltd.); KAYARAD® DPHA, NPGDA and PET30 (Nippon Kayaku Co., Ltd.); NK Ester A-DPH, A-TMPT, A-DCP, A-HD-N, TMPT, DCP, NPG and HD-N (all from Shin-Nakamura Chemical Co., Ltd.); NK Oligo U-15HA (Shin-Nakamura Chemical Co., Ltd.); NK Polymer Vanaresin GH-1203 (Shin-Nakamura Chemical Co., Ltd.); and EBECRYL® 11, 40, 135, 140, 145, 150, 180, 1142, OTA480, IRR214-K and PEG400DA-D (Daicel-Allnex Ltd.).

Other poly(meth)acrylic compounds that may be used include the following polyfunctional urethane acrylates: EBECRYL® 204, 205, 210, 215, 220, 230, 244, 245, 270, 284, 285, 264, 265, 294/25HD, 1259, 1290, 4820, 4858, 5120, 8210, 8254, 8301R, 8405, 8465, 8296, 8307, 8402, 8311, 8411, 8701, 8800, 8804, 8807, 9260, 9270, 9277EA, KRM7735, 8200, 8452, 8528, 8667 and 8904 (all from Daicel-Allnex Ltd.), and also UV-1700B, UV-6300B, UV-7510B, UV-7550V, UV-7550B, UV-7600B, UV-7605B, UV-7610B, UV-7620EA, UV-7630B, UV-7640B AND UV-7650B (all from The Nippon Synthetic Chemical Industry Co., Ltd.); the following polyfunctional polyester acrylates: EBECRYL® 436, 438, 446, 450, 524, 525, 800, 810, 811, 812, 1830, 846, 851, 852, 853, 1870, 884 and 885 (all from Daicel-Allnex Ltd.); and the following epoxy acrylates: EBECRYL® 600, 605, 645, 648, 860, 1606, 3500, 3603, 3608, 3700, 3701, 3702, 3703, 3708 and 6040 (all from Daicel-Allnex Ltd.).

The acid anhydride compounds are not particularly limited, provided they are carboxylic acid anhydrides obtained by the dehydration/condensation of two molecules of carboxylic acid. Examples include those having one acid anhydride group per molecule, such as phthalic anhydride, tetrahydrophthalic anhydride, hexahydrophthalic anhydride, methyl tetrahydrophthalic anhydride, methyl hexahydrophthalic anhydride, nadic anhydride, methyl nadic anhydride, maleic anhydride, succinic anhydride, octyl succinic anhydride and dodecenyl succinic anhydride; and those having two acid anhydride groups per molecule, such as 1,2,3,4-cyclobutanetetracarboxylic dianhydride, pyromellitic dianhydride, 3,4-dicarboxy-1,2,3,4-tetrahydro-1-naphthalenesuccinic dianhydride, bicyclo[3.3.0]octane-2,4,6,8-tetracarboxylic dianhydride, 5-(2,5-dioxotetrahydro-3-furanyl)-3-methyl-3-cyclohexene-1,2-dicarboxylic anhydride, 1,2,3,4-butanetetracarboxylic dianhydride, 3,3',4,4'-benzophenonetetracarboxylic dianhydride, 3,3',4,4'-biphenyltetracarboxylic dianhydride, 2,2-bis(3,4-dicarboxyphenyl)hexafluoropropane dianhydride and 1,3-dimethyl-1,2,3,4-cyclobutanetetracarboxylic dianhydride.

The compounds containing blocked isocyanate groups are not particularly limited, provided they are compounds having at least two blocked isocyanate groups per molecule, i.e., isocyanate groups (—NCO) that have been blocked with suitable protecting groups, and in which, upon exposure of the compound to an elevated temperature during heat curing, the protecting groups (blocking moieties) are removed by thermal dissociation and the isocyanate groups that form as a result induce crosslinking reactions with the resin. Such compounds are exemplified by compounds having at least two groups of the following formula (which groups may be the same or may each differ) per molecule.

[Chemical Formula 15]

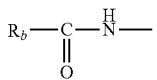

In the formula, $R_b$ is an organic group on the blocking moiety.

Such a compound can be obtained by, for example, reacting a suitable blocking agent with a compound having at least two isocyanate groups per molecule.

Examples of compounds having at least two isocyanate groups per molecule include polyisocyanates such as isophorone diisocyanate, 1,6-hexamethylene diisocyanate, methylenebis(4-cyclohexyl isocyanate) and trimethylhexamethylene diisocyanate, and also dimers and trimers thereof, as well as the reaction products of these with diols, triols, diamines or triamines.

Examples of the blocking agent include alcohols such as methanol, ethanol, isopropanol, n-butanol, 2-ethoxyhexanol, 2-N,N-dimethylaminoethanol, 2-ethoxyethanol and cyclohexanol; phenols such as phenol, o-nitrophenol, p-chlorophenol, and o-, m- and p-cresol; lactams such as ε-caprolactam; oximes such as acetone oxime, methyl ethyl ketone oxime, methyl isobutyl ketone oxime, cyclohexanone oxime, acetophenone oxime and benzophenone oxime; pyrazoles such as pyrazole, 3,5-dimethylpyrazole and 3-methylpyrazole; and thiols such as dodecanethiol and benzenethiol.

The compound containing blocked isocyanate groups may also be acquired as a commercial product, examples of which include B-830, B-815N, B-842N, B-870N, B-874N, B-882N, B-7005, B7030, B-7075 and B-5010 (all from Mitsui Chemicals Polyurethanes, Inc.); Duranate® 17B-60PX, TPA-B80E, MF-B60X, MF-K60X and E402-B80T (all from Asahi Kasei Chemicals Corporation); and KarenzMOI-BM® (Showa Denko KK).

The aminoplast compounds are not particularly limited, provided they are compounds which have at least two methoxymethylene groups per molecule. Examples include the following melamine compounds: compounds of the Cymel® series, such as Cymel® 303 (hexamethoxymethylmelamine), 1170 (tetrabutoxymethylglycoluril) and 1123 (tetramethoxymethylbenzoguanamine) (all from Daicel-Allnex Ltd.); and compounds of the Nikalac® series, including the methylated melamine resins Nikalac® MW-30HM, MW-390, MW-100LM and MX-750LM, and the methylated urea resins Nikalac® MX-270, MX-280 and MX-290 (all from Sanwa Chemical Co., Ltd.).

The oxetane compounds are not particularly limited, provided they are compounds which have at least two oxetanyl groups per molecule. Examples include the oxetane group-bearing compounds OXT-221, OX-SQ-H and OX-SC (from Toagosei Co., Ltd.).

Phenoplast compounds are compounds which have at least two hydroxymethylene groups per molecule. Upon exposure to an elevated temperature during heat curing, crosslinking reactions proceed by way of dehydration/condensation reactions with the hyperbranched polymer used in the invention. Examples of phenoplast compounds include 2,6-dihydroxymethyl-4-methylphenol, 2,4-dihydroxymethyl-6-methylphenol, bis(2-hydroxy-3-hydroxymethyl-5-methylphenyl)methane, bis(4-hydroxy-3-hydroxymethyl-5-methylphenyl)methane, 2,2-bis(4-hydroxy-3,5-dihydroxymethylphenyl)propane, bis(3-formyl-4-hydroxyphenyl)methane, bis(4-hydroxy-2,5-dimethylphenyl)formylmethane and α,α-bis(4-hydroxy-2,5-dimethylphenyl)-4-formyltoluene.

The phenoplast compound may also be acquired as a commercial product, illustrative examples of which include 26DMPC, 46DMOC, DM-BIPC-F, DM-BIOC-F, TM-BIP-A, BISA-F, BI25X-DF and BI25X-TPA (all from Asahi Organic Chemicals Industry Co., Ltd.).

Crosslinking agent A is preferably a compound in which the molecular weight is at least 1,000 owing to a long chain length between crosslink-forming groups. Specifically, it is preferably a compound in which the chain length between crosslink-forming groups is long because the compound has, for example, a polyether structure, polyester structure or polyurethane structure. Of the crosslinking agents mentioned above, illustrative examples of crosslinking agent A include NK Ester A-GLY-20E, ATM-35E, AT-20E, 23G, A-BPE-20BPE-900 AND BPE-1300N (all from Shin-Nakamura Chemical Co., Ltd.); EBECRYL® 204, 205, 210, 215, 230, 244, 245, 270, 284, 285, 264, 265, 294/25HD, 1259, 1290, 4820, 8254, 8301R, 8405, 8465, 8296, 8307, 8411, 8701, 8800, 8804, 9260, 9277EA, KRM8200, 8452, 8528, 8667, 8904, 436, 438, 446, 450, 525, 1830, 846, 1870, 884, 885, 860 and 3708 (Daicel-Allnex Ltd.); and UV-1700B, UV-6300B, UV-7510B, UV-7550V, UV-7550B, UV-7600B, UV-7605B, UV-7610B, UV-7620EA, UV-7630B, UV-7640B and UV-7650B (The Nippon Synthetic Chemical Industry Co., Ltd.). Of these, preferred examples include NKE Ester A-GLY-20E and ATM-35E.

Of the crosslinking agents mentioned above, illustrative examples of crosslinking agent B having a molecular weight of less than 1,000 include Aronix® M-303, M-305, M-305, M-306, M-400, M-402, M-403, M-404, M-405, M-406, M-450 and M-452 (Toagosei Co., Ltd.); NK Ester A-9300, A-9300-1CL, A-TMM-3, A-TMM-3L, A-TMPT, A-TMP, A-TMMT, A-DPH, 1G, 2G, 3G, 4G, 9G, 14G, ABE-300, A-BPE-4, A-BPE-6, A-BPE-10, A-BPE-20, A-BPE-30, BPE-80N, BPE-100N, BPE-200 and BPE-500 (Shin-Nakamura Chemical Co., Ltd.); and EBECRYL® 11, 40, 135, 140, 145, 150, 180, 800, 853, 860, 1142, 4858, 5129, 8210, 600, 605, 645, 648, 1606, 3500, 3603, 3608, 3700, 3701, 3702, 3703, 6040 and OTA480 (Daicel-Allnex Ltd.). Of these, Aronix® M-303, M-305, M-305, M-306, M-400, M-402, M-403, M-404, M-405, M-406, M-450 and M-452 (Toagosei Co., Ltd.); and NK Ester A-9300 and A-9300-1CL (Shin-Nakamura Chemical Co., Ltd.) are preferred.

From the standpoint of being able to suppress a decrease in refractive index due to crosslinking agent addition and enabling the curing reaction to proceed rapidly, poly(meth) acrylic compounds are preferred as crosslinking agents A and B.

Each of crosslinking agents A and B may be used singly or may be used as combinations of two or more crosslinking agents. Crosslinking agent A is used in an amount which is preferably from 0.1 to 30 parts by weight per 100 parts by weight of the triazine ring-containing hyperbranched polymer. However, taking into account the solvent resistance, the lower limit is preferably 1 part by weight, and more preferably 5 parts by weight. Also, to control the refractive index, the upper limit is preferably 25 parts by weight, and more preferably 20 parts by weight. Crosslinking agent B is used in an amount, per 100 parts by weight of crosslinking agent A, of preferably 0.5 to 400 parts by weight, and more preferably 50 to 200 parts by weight. At less than 0.5 part by weight, the transparent conductive film protecting effect may not improve. On the other hand, use in an amount of more than 400 parts by weight may lead to a marked decline in the refractive index.

[Solvent]

Any of various solvents is preferably added to the composition of the invention and used to dissolve the triazine ring-containing hyperbranched polymer. The solvent may be the same as or different from the solvent used in polymerization. This solvent is not particularly limited, so long as there is no loss of compatibility with the polymer.

Illustrative examples of solvents that may be used include toluene, p-xylene, o-xylene, m-xylene, ethylbenzene, styrene, ethylene glycol dimethyl ether, propylene glycol monomethyl ether, ethylene glycol monomethyl ether, propylene glycol, propylene glycol monoethyl ether, ethylene glycol monoethyl ether, ethylene glycol monoisopropyl ether, ethylene glycol methyl ether acetate, propylene glycol monomethyl ether acetate, ethylene glycol ethyl ether acetate, diethylene glycol dimethyl ether, propylene glycol monobutyl ether, ethylene glycol monobutyl ether, diethylene glycol diethyl ether, dipropylene glycol monomethyl ether, diethylene glycol monomethyl ether, dipropylene glycol monoethyl ether, diethylene glycol monoethyl ether, triethylene glycol dimethyl ether, diethylene glycol monoethyl ether acetate, diethylene glycol, 1-octanol, ethylene glycol, hexylene glycol, trimethylene glycol, 1-methoxy-2-butanol, cyclohexanol, diacetone alcohol, furfuryl alcohol, tetrahydrofurfuryl alcohol, propylene glycol, benzyl alcohol, 1,3-butanediol, 1,4-butanediol, 2,3-butanediol, γ-butyrolactone, acetone, methyl ethyl ketone, methyl isopropyl ketone, diethyl ketone, methyl isobutyl ketone, methyl n-butyl ketone, cyclohexanone, ethyl acetate, isopropyl acetate, n-propyl acetate, isobutyl acetate, n-butyl acetate, ethyl lactate, methanol, ethanol, isopropanol, tert-butanol, allyl alcohol, n-propanol, 2-methyl-2-butanol, isobutanol, n-butanol, 2-methyl-1-butanol, 1-pentanol, 2-methyl-1-pentanol, 2-ethylhexanol, 1-methoxy-2-propanol, tetrahydrofuran, 1,4-dioxane, N,N-dimethylformamide, N,N-dimethylacetamide, N-methylpyrrolidone, 1,3-dimethyl-2-imidazolidinone, dimethylsulfoxide and N-cyclohexyl-2-pyrrolidinone. These may be used singly or two or more may be used in combination.

The solids concentration in the composition is not particularly limited, provided it is in a range that does not adversely affect the storage stability, and may be suitably selected according to the target film thickness. From the standpoint of solubility and storage stability, the solids concentration is preferably from 0.1 to 50 wt %, and more preferably from 0.2 to 40 wt %.

[Initiator]

Initiators for each crosslinking agent may be included in the inventive composition. Also, as mentioned above, when polyepoxy compounds and/or poly(meth)acrylic compounds are used as the crosslinking agents, although photocuring proceeds in the composition and a cured film can be obtained even without the use of an initiator, it is possible to use an initiator in such cases.

When a polyepoxy compound is used as the crosslinking agent, a photoacid generator or a photobase generator may be used.

The photoacid generator used may be one that is suitably selected from among known photoacid generators. For example, use may be made of onium salt derivatives such as diazonium salts, sulfonium salts and iodonium salts. Illustrative examples include aryldiazonium salts such as phenyldiazonium hexafluorophosphate, 4-methoxyphenyldiazonium hexafluoroantimonate and 4-methylphenyldiazonium hexafluorophosphate; diaryliodonium salts such as diphenyliodonium hexafluoroantimonate, di(4-methylphenyl)iodonium hexafluorophosphate and di(4-tert-butylphenyl)iodonium hexafluorophosphate; and triarylsulfonium salts such as triphenylsulfonium hexafluoroantimonate, tris(4-methoxyphenyl)sulfonium hexafluorophosphate, diphenyl-4-thiophenoxyphenylsulfonium hexafluoroantimonate, diphenyl-4-thiophenoxyphenylsulfonium hexafluorophosphate, 4,4'-bis(diphenylsulfonio)phenylsulfide bishexafluoroantimonate, 4,4'-bis(diphenylsulfonio)phenylsulfide bishexafluorophosphate, 4,4'-bis[di(β-hydroxyethoxy)phenylsulfonio]phenylsulfide bishexafluoroantimonate, 4,4'-bis[di(β-hydroxyethoxy)phenylsulfonio]phenylsulfide bishexafluorophosphate, 4-[4'-(benzoyl)phenylthio]phenyl-di(4-fluorophenyl)sulfonium hexafluoroantimonate and 4-[4'-(benzoyl)phenylthio]phenyl-di(4-fluorophenyl)sulfonium hexafluorophosphate.

Commercial products may be used as these onium salts. Illustrative examples include San-Aid SI-60, SI-80, SI-100, SI-60L, SI-80L, SI-100L, SI-L145, SI-L150, SI-L160, SI-L110 and SI-L147 (all available from Sanshin Chemical Industry Co., Ltd.); UVI-6950, UVI-6970, UVI-6974, UVI-6990 and UVI-6992 (all available from Union Carbide); CPI-100P, CPI-100A, CPI-200K and CPI-200S (all available from San-Apro Ltd.); Adeka Optomer SP-150, SP-151, SP-170 and SP-171 (all available from Adeka Corporation); Irgacure® 261 (BASF); CI-2481, CI-2624, CI-2639 and CI-2064 (Nippon Soda Co., Ltd.); CD-1010, CD-1011 and CD-1012 (Sartomer Company); DS-100, DS-101, DAM-101, DAM-102, DAM-105, DAM-201, DSM-301, NAI-100, NAI-101, NAI-105, NAI-106, SI-100, SI-101, SI-105, SI-106, PI-105, NDI-105, BENZOIN TOSYLATE, MBZ-101, MBZ-301, PYR-100, PYR-200, DNB-101, NB-101, NB-201, BBI-101, BBI-102, BBI-103 and BBI-109 (all from Midori Kagaku Co., Ltd.); PCI-061T, PCI-062T, PCI-020T and PCI-022T (all from Nippon Kayaku Co., Ltd.); and IBPF and IBCF (Sanwa Chemical Co., Ltd.).

The photobase generator used may be one selected from among known photobase generators. For example, use may be made of Co-amine complex-type, oxime carboxylic acid ester-type, carbamic acid ester-type and quaternary ammonium salt-type photobase generators. Illustrative examples include 2-nitrobenzylcyclohexyl carbamate, triphenylmethanol, O-carbamoylhydroxylamide, O-carbamoyloxime, [[(2,6-dinitrobenzyl)oxy]carbonyl]cyclohexylamine, bis [[(2-nitrobenzyl)oxy]carbonyl]hexane-1,6-diamine, 4-(methylthiobenzoyl)-1-methyl-1-morpholinoethane, (4-morpholinobenzoyl)-1-benzyl-1-dimethylaminopropane, N-(2-nitrobenzyloxycarbonyl)pyrrolidine, hexaamminecobalt(III) tris(triphenylmethylborate), 2-benzyl-2-dimethylamino-1-(4-morpholinophenyl)butanone, 2,6-dimethyl-3,5-diacetyl-4-(2'-nitrophenyl)-1,4-dihydropyridine and 2,6-dimethyl-3,5-diacetyl-4-(2',4'-dinitrophenyl)-1,4-dihydropyridine.

A commercial product may be used as the photobase generator. Illustrative examples include TPS-OH, NBC-101 and ANC-101 (all available under these product names from Midori Kagaku Co., Ltd.).

When a photoacid generator or photobase generator is used, the amount thereof is preferably in the range of 0.1 to 15 parts by weight, and more preferably in the range of 1 to 10 parts by weight, per 100 parts by weight of the polyepoxy compound.

Also, from 1 to 100 parts by weight of an epoxy resin curing agent may be optionally included per 100 parts by weight of the polyepoxy compound.

In cases where a poly(meth)acrylic compound is used, a photoradical initiator may also be used. A known photoradical initiator may be suitably selected and used for this purpose. Exemplary photoradical initiators include acetophenones, benzophenones, Michler's benzoyl benzoate, amyloxime esters, tetramethylthiuram monosulfide and thioxanthones.

Photocleavable photoradical initiators are especially preferred. Photocleavable photoradical initiators are listed on page 159 of Saishin UV Koka Gijutsu [Recent UV Curing Technology] (publisher, K. Takausu; published by Gijutsu Joho Kyokai KK; 1991).

Examples of commercial photoradical initiators include Irgacure® 127, 184, 369, 379, 651, 500, 819, 907, 784, 2959, OXE01, OXE02, CGI1700, CGI1750, CGI1850 and CG24-61, Darocur 1116 and 1173, and Lucirin TPO (all available from BASF); UVECRYL® P36 (Cytec Surface Specialties S.A.); and ESACURE® KIP150, KIP65LT, KIP100F, KT37, KT55, KT046 and KIP75/B (Fratelli Lamberti Company).

The photoradical initiator is used in the range of preferably 0.1 to 15 parts by weight, and more preferably 0.1 to 10 parts by weight, per 100 parts by weight of the poly(meth) acrylic compound.

[Other Ingredients]

The film-forming composition of the invention may include other ingredients, so long as doing so does not detract from the advantageous effects of the invention. Examples of such other ingredients include leveling agents and surfactants.

Illustrative examples of leveling agents and surfactants include the following nonionic surfactants: polyoxyethylene alkyl ethers such as polyoxyethylene lauryl ether, polyoxyethylene stearyl ether, polyoxyethylene cetyl ether and polyoxyethylene oleyl ether; polyoxyethylene alkyl aryl ethers such as polyoxyethylene octyl phenyl ether and polyoxyethylene nonyl phenyl ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate; and additionally include fluorosurfactants such as Eftop® EF301, EF303 and EF352 (from Mitsubishi Materials Electronic Chemicals Co., Ltd., Megafac® F171, F173, R-08, R-30, R-40, R-43, F-553, F-554, R-556, R-559, RS-75 and RS-72-K (DIC Corporation), FLUORAD® FC430 and FC431 (The 3M Company), AsahiGuard® AG710 (Asahi Glass Co., Ltd.), and Surflon® S-382, SCi01, SC102, SC103, SC104, SC105 and SC106 (AGC Seimi Chemical Co., Ltd.); and also the organosiloxane polymers KP341 (Shin-Etsu Chemical Co., Ltd.) and BYK-302, BYK-307, BYK-322, BYK-323, BYK-330, BYK-333, BYK-370, BYK-375 and BYK-378 (from BYK).

These may be used singly or two or more may be used in combination. The amount of surfactant used per 100 parts by weight of the triazine ring-containing hyperbranched polymer is preferably from 0.0001 to 5 parts by weight, more preferably from 0.001 to 1 part by weight, and even more preferably from 0.01 to 0.5 part by weight.

The other ingredients mentioned above may be added in any step during preparation of the inventive composition.

[Protective Film for Use on a Transparent Conductive Film]

The inventive protective film for use on a transparent conductive film may be formed by coating the above-described protective film-forming composition onto a transparent conductive film, optionally heating to evaporate off the solvent, and subsequently heating or carrying out light exposure.

The density of the protective film is preferably from 1.20 to 1.45 $g/cm^3$, and more preferably from 1.30 to 1.45 $g/cm^3$. A film density below 1.20 $g/cm^3$ may lead to an increase in the percent change in resistance.

The range in the refractive index of the protective film of the invention has a lower limit of preferably 1.60, more preferably 1.65, and even more preferably 1.70. There is no particular upper limit, although the refractive index is typically not more than about 1.95 to 2.00.

The protective film of the invention has a thickness which is preferably from 10 to 1,000 nm, and more preferably from 50 to 200 nm.

The transparent conductive film on which the protective film of the invention is formed has a haze value of preferably not more than 1.5%, and more preferably not more than 1.0%.

Any suitable method may be used for applying the composition, such as spin coating, dipping, flow coating, inkjet printing, spray coating, bar coating, gravure coating, slit coating, roll coating, transfer printing, brush coating, blade coating and air knife coating.

The transparent conductive film is preferably an ITO film, an IZO film, or a transparent conductive film having electrically conductive nanostructures such as metal nanoparticles, metal nanowires or metal nanomeshes. A transparent conductive film having electrically conductive nanostructures is more preferred. The metal making up the conductive nanostructures is not particularly limited. Examples include silver, gold, copper, nickel, platinum, cobalt, iron, zinc, ruthenium, rhodium, palladium, cadmium, osmium, iridium, and alloys thereof. That is, a transparent conductive film having, for example, silver nanoparticles, silver nanowires, silver nanomeshes, gold nanoparticles, gold nanowires, gold nanomeshes, copper nanoparticles, copper nanowires or copper nanomeshes, is preferred. A transparent conductive film having silver nanowires is especially preferred.

The bake temperature for evaporating off the solvent is not particularly limited. The bake may be carried out at, for example, from 40 to 400° C. The bake process is not particularly limited. For example, evaporation may be effected using a hot plate or an oven, such evaporation being carried out under a suitable atmosphere, such as in open air, in nitrogen or another inert gas, or in a vacuum. With regard to the bake temperature and time, conditions which are compatible with the processing steps for the target electronic device should be selected. Bake conditions should be selected in such a way that the physical values of the resulting film conform to the required characteristics of the electronic device.

The conditions in cases where exposure to light is carried out are also not particularly limited, so long as the exposure energy and time employed are suitable for the triazine ring-containing hyperbranched polymer and the crosslinking agent that are used. For example, exposure may be carried out at from 50 to 1,000 $mJ/cm^2$. Light exposure is preferably carried out in open air or in an inert gas atmosphere such as nitrogen.

The protective film of the invention is particularly suitable as a protective film for transparent conductive films having electrically conductive nanostructures. Transparent conductive films having conductive nanostructures tend to cloud due to the irregular reflection of light by the conductive nanostructures, sometimes resulting in a poor visibility. Because the protective film of the invention has a high transparency and a high refractive index, it prevents clouding due to the irregular reflection of light by a transparent conductive film that uses conductive nanostructures, enabling the visibility to be improved. In addition, because the protective film of the invention has a high heat resistance and a resistance to elevated temperature and humidity, it can also help to prevent deterioration of the transparent conductive film. The protective film of the invention is thus suitable as a component for use in transparent electrodes. Also, because the protective film of the invention is able to achieve a high solubility and a low volume shrinkage, it can be advantageously used as a component in the manufacture of electronic devices such as liquid-crystal displays, organic electroluminescence (EL) displays, touch panels, optical semiconductor (LED) devices, solid-state image sensors, organic thin-film solar cells, dye-sensitized solar cells and organic thin-film-transistors (TFTs).

EXAMPLES

Synthesis Examples, Production Example, Working Examples, and Comparative Examples are given below to more concretely illustrate the invention, although the invention is not limited by these Examples. The instruments used in the Examples were as follows.

[$^1$H-NMR]
  Instruments: Varian NMR System 400 NB (400 MHz)
  JEOL-ECA700 (700 MHz)
  Solvent used in measurement: DMSO-d6
  Reference material: Tetramethylsilane (TMS) ($\delta$=0.0 ppm)
[GPC]
  Instrument: HLC-8200 GPC (Tosoh Corporation)
  Columns: Shodex KF-804L+KF-805L
  Column temperature: 40° C.
  Solvent: Tetrahydrofuran (THF)
  Detector: UV (254 nm)
  Calibration curve: polystyrene standard
[Ellipsometer]
  Instrument: VASE multiple incident angle spectroscopic ellipsometer (JA Woollam Japan)
[Thermogravimetric/Differential Thermal Analyzer (TG-DTA)]
  Instrument: TG-8120 (Rigaku Corporation)
  Temperature ramp-up rate: 10° C./min
  Measurement temperatures: 25° C. to 750° C.

[Elevated Temperature and Humidity Tester]
Instrument: LHU-113 Constant Climate Cabinet (ESPEC Corporation)
[Haze Meter]
Instrument: NDH 5000 (Nippon Denshoku Industries Co., Ltd.)
[Optical Microscope]
Instrument: BX51 Research Microscope (Olympus Corporation)
[Non-Contact Sheet Resistance Tester]
Instrument: EC-80 (Napson)
[Film Density Measurement]
Instrument: D8 Discover multifunctional x-ray diffraction system for evaluation of thin-film materials (Bruker AXS GmbH)

Synthesis Example 1

Synthesis of Triazine Ring-Containing Hyperbranched Polymer

[Chemical Formula 16]

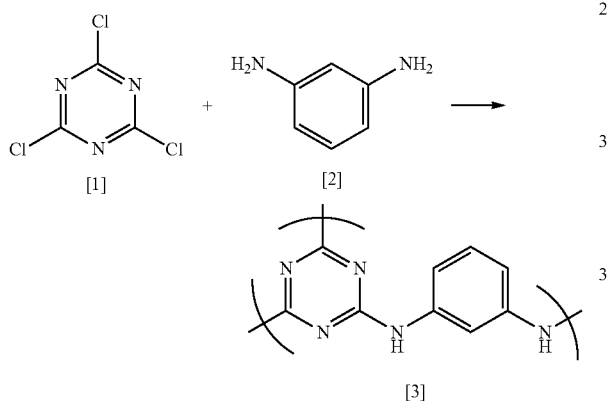

In a nitrogen atmosphere, 456.02 g of dimethylacetamide (DMAc) was added to a 1,000 mL four-neck flask and cooled to −10° C. in an acetone-dry ice bath, following which 84.83 g (0.460 mol) of 2,4,6-trichloro-1,3,5-triazine [1] (Evonik Degussa) was added and dissolved therein. Next, a solution of 62.18 g (0.575 mol) of m-phenylenediamine [2] dissolved in 304.01 g of DMAc, and 14.57 g (0.156 mol) of aniline were added dropwise. After dropwise addition, the flask contents were stirred for 30 minutes. Using a fluid transfer pump, the reaction mixture was added dropwise over a period of 1 hour to a 2,000 mL four-neck flask that already contained 621.85 g of DMAc and had been heated beforehand to 85° C. in an oil bath. Following addition of the reaction mixture, stirring was carried out for 1 hour, effecting polymerization.

Next, aniline (113.95 g, 1.224 mol) was added and the flask contents were stirred for 1 hour, bringing the reaction to completion. The system was cooled to room temperature in an ice bath, after which triethylamine (116.36 g, 1.15 mol) was added dropwise and 30 minutes of stirring was carried out, thereby quenching the hydrochloric acid. The hydrochloride that settled out was then removed by filtration. The filtered reaction mixture was reprecipitated in a mixed solution of 28% ammonia water (279.29 g) and deionized water (8,820 g). The precipitate was filtered off, dried in a vacuum desiccator at 150° C. for 8 hours, then redissolved in THF (833.1 g) and reprecipitated in deionized water (6,665 g). The resulting precipitate was filtered off, then dried in a vacuum desiccator at 150° C. for 25 hours, yielding 118.0 g of the target hyperbranched polymer [3] (referred to below as "HB-TmDA40").

FIG. 1 shows the measured $^1$H-NMR spectrum for HB-TmDA40. The weight-average molecular weight Mw of HB-TmDA40 was 4,300 and the polydispersity Mw/Mn was 3.44.

(1) Heat-Resistance Test

Figure 2:
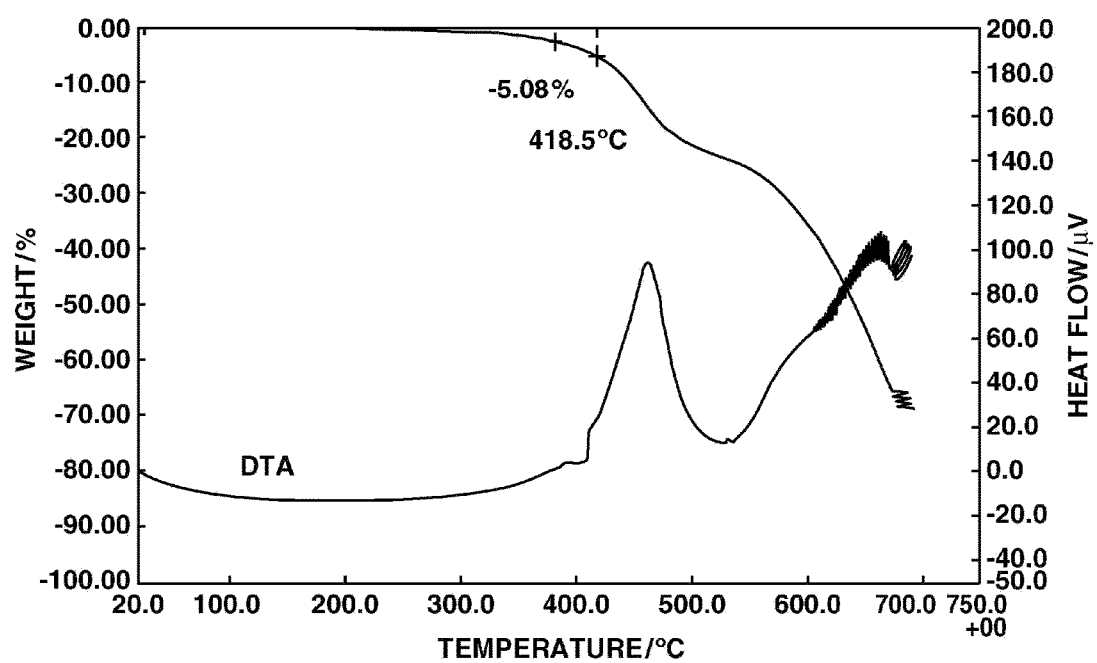
FIG. 2 is a graph showing the TG-DTA results for HB-TmDA40 obtained in Synthesis Example 1.

The results of TG-DTA measurements on the HB-TmDA40 obtained in Synthesis Example 1 are shown in FIG. 2. The 5% weight loss temperature was 419° C.

(2) Measurement of Refractive Index

The HB-TmDA40 obtained in Synthesis Example 1 (0.5 g) was dissolved in 4.5 g of cyclohexanone, giving a clear, light yellow-colored solution. Using a spin coater, the resulting solution was spin-coated onto a glass substrate at 200 rpm for 5 seconds and at 2,000 rpm for 30 seconds, following which the solvent was removed by heating at 150° C. for 1 minute and at 250° C. for 5 minutes, giving a film having a thickness of 500 nm. The refractive index at 550 nm of the resulting film was measured and found to be 1.790.

Production Example 1

A 20 wt % solution (referred to below as "HB-TmDA40V1") was prepared by dissolving 100 g of the HB-TmDA40 obtained in Synthesis Example 1 in a mixed solvent consisting of 384.0 g of cyclohexanone and 16.0 g of deionized water.

Production Example 2

Production of Silver Nanowire Dispersion

Conductive Ink A was produced by diluting 50 g of a silver nanowire dispersion (ClearOhm, from Cambrios Technologies Corporation) with 50 g of isopropyl alcohol.

Production Example 3

Production of Transparent Conductive Film

Conductive Ink A produced in Production Example 2 was spin-coated onto an alkali-free glass substrate at 200 rpm for 5 second, then at 900 rpm for 30 seconds to form a film, following which the applied film was dried on a hot plate at 120° C. for 1 minute to produce a transparent conductive film.

Working Example 1

Preparation 1 of Protective Film-Forming Composition

A varnish (referred to below as "HB-TmDA40VF1") having a total solids concentration of 3 wt % was prepared by adding together 5.0 g of the HB-TmDA40V1 solution prepared in Production Example 1, 0.5 g of a 10 wt % cyclohexanone solution of A-9300 (molecular weight, 423; from Shin-Nakamura Chemical Co., Ltd.), 0.167 g of a 60 wt % cyclohexanone solution of ethoxylated pentaerythritol tetraacrylate (ATM-35E, 350 mPa·s; molecular weight, 1,892; from Shin-Nakamura Chemical Co., Ltd.), 1.6 g of a 5 wt % cyclohexanone solution of the photoradical initiator Irgacure 184 (BASF), 0.05 g of a 1 wt % cyclohexanone solution of the surfactant Megafac R-30-N (DIC Corporation), 1.35 g of deionized water and 32.4 g of cyclohexanone, and then visually checking that dissolution had occurred.

Working Example 2

Preparation 2 of Protective Film-Forming Composition

A varnish (referred to below as "HB-TmDA40VF2") having a total solids concentration of 3 wt % was prepared by adding together 1.0 g of the HB-TmDA40V1 solution prepared in Production Example 1, 0.4 g of a 10 wt % cyclohexanone solution of M-403 (a mixture of a pentaacrylate (molecular weight, 524) and a hexaacrylate (molecular weight, 579) from Toagosei Co., Ltd.), 0.2 g of a 10 wt % cyclohexanone solution of ethoxylated pentaerythritol tetraacrylate (ATM-35E, 350 mPa·s; molecular weight, 1,892; from Shin-Nakamura Chemical Co., Ltd.), 0.32 g of a 5 wt % cyclohexanone solution of the photoradical initiator Irgacure 184 (BASF), 0.01 g of a 1 wt % cyclohexanone solution of the surfactant Megafac R-30-N (DIC Corporation), 0.29 g of deionized water and 8.47 g of cyclohexanone, and then visually checking that dissolution had occurred.

Working Example 3

Preparation 3 of Protective Film-Forming Composition

A varnish (referred to below as "HB-TmDA40VF3") having a total solids concentration of 3 wt % was prepared by adding together 1.0 g of the HB-TmDA40V1 solution prepared in Production Example 1, 0.033 g of a 60 wt % cyclohexanone solution of ethoxylated glycerol triacrylate (A-GLY-20E, 200 mPa·s; molecular weight, 1,295; from Shin-Nakamura Chemical Co., Ltd.), 0.033 g of a 60 wt % cyclohexanone solution of ethoxylated pentaerythritol tetraacrylate (ATM-35E, 350 mPa·s; molecular weight, 1,892; from Shin-Nakamura Chemical Co., Ltd.), 0.32 g of a 5 wt % cyclohexanone solution of the photoradical initiator Irgacure 184 (BASF), 0.01 g of a 1 wt % cyclohexanone solution of the surfactant Megafac R-30-N (DIC Corporation), 0.37 g of deionized water and 8.47 g of cyclohexanone, and then visually checking that dissolution had occurred.

Working Examples 4 to 6

Measurement of Refractive Index

The varnishes obtained in Working Examples 1 to 3 were spin-coated onto soda-lime-silica glass substrates with a spin coater at 200 rpm for 5 seconds and at 1,000 rpm for 30 seconds, and an oven was used to carry out a 3-minute bake at 130° C. The applied varnishes were then cured using a high-pressure mercury vapor lamp, either in open air (Working Examples 4 and 6) or in a nitrogen atmosphere (Working Example 5), at a cumulative exposure dose of 400 mJ/cm$^2$, giving cured films having a thickness of 100 nm. Table 1 shows the results obtained from measurement of the refractive indices of the resulting films.

TABLE 1

| | Varnish | Exposure environment | Refractive index |
|---|---|---|---|
| Working Example 4 | HB-TmDA40VF1 | open air | 1.790 |
| Working Example 5 | HB-TmDA40VF2 | nitrogen atmosphere | 1.756 |
| Working Example 6 | HB-TmDA40VF3 | open air | 1.818 |

Working Examples 7 to 9

Measurement of Film Density

The varnishes prepared in Working Examples 1 to 3 were spin-coated onto silicon wafer substrates with a spin coater at 200 rpm for 5 seconds and at 1,000 rpm for 30 seconds, and an oven was used to carry out a 3-minute bake at 130° C. The applied varnishes were then cured using a high-pressure mercury vapor lamp, either in open air or in a nitrogen atmosphere, at a cumulative exposure dose of 400 mJ/cm$^2$, giving cured films having a thickness of 100 nm. X-ray reflectometry (XRR) measurements were carried out on the cured films, and the film densities were calculated. Table 2 shows the varnish used in each example, the exposure environment and the results of film density measurements.

TABLE 2

| | Varnish | Exposure environment | Film density (g/cm$^3$) |
|---|---|---|---|
| Working Example 7 | HB-TmDA40VF1 | open air | 1.37 |
| Working Example 8 | HB-TmDA40VF2 | nitrogen atmosphere | 1.36 |
| Working Example 9 | HB-TmDA40VF3 | open air | 1.35 |

Working Examples 10 to 14, Comparative Example 1

Measurement of Haze Value and Sheet Resistance

The varnishes prepared in Working Examples 1 to 3 were diluted with cyclohexanone to a solids concentration of 2% and spin-coated with a spin coater at 200 rpm for 5 seconds and at 1,000 rpm for 30 seconds onto the transparent conductive film produced in Production Example 3, and an oven was used to carry out a 3-minute bake at 130° C. The applied varnishes were then cured using a high-pressure mercury vapor lamp, either in open air or in a nitrogen atmosphere, at a cumulative exposure dose of 400 mJ/cm$^2$, giving protective films having a thickness of 50 nm. The haze values of these films were measured (Working Examples 10 to 14). In addition, as Comparative Example 1, the haze value of the transparent conductive film produced in Production Example 3 was measured. Table 3 shows the varnishes and exposure environments used in each example, and also the results obtained from the haze value measurements carried out in the working examples and the comparative example.

TABLE 3

| | Varnish | Exposure environment | Haze value (%) |
|---|---|---|---|
| Working Example 10 | HB-TmDA40VF1 | open air | 0.89 |
| Working Example 11 | HB-TmDA40VF1 | nitrogen atmosphere | 0.78 |

TABLE 3-continued

| | Varnish | Exposure environment | Haze value (%) |
|---|---|---|---|
| Working Example 12 | HB-TmDA40VF2 | nitrogen atmosphere | 0.92 |
| Working Example 13 | HB-TmDA40VF3 | open air | 0.86 |
| Working Example 14 | HB-TmDA40VF3 | nitrogen atmosphere | 0.92 |
| Comparative Example 1 | — | — | 1.61 |

The samples used in Working Examples 10 to 14 and Comparative Example 1 were each placed in a test chamber set to an internal temperature of 85° C. and a relative humidity of 85% and held under those conditions for 47, 168, 360 and 500 hours, following which the change in sheet resistance was measured. Those results are shown in Table 4. In Table 4, "0 h" indicates the sheet resistance immediately after sample production.

TABLE 4

| | Varnish | Exposure environment | Sheet resistance ($\Omega/\square$) after elapsed times shown below | | | | |
|---|---|---|---|---|---|---|---|
| | | | 0 h | 47 h | 168 h | 360 h | 500 h |
| Working Example 10 | HB-TmDA40VF1 | open air | 98 | 105 | 134 | 161 | 183 |
| Working Example 11 | HB-TmDA40VF1 | nitrogen atmosphere | 98 | 109 | 119 | 143 | 170 |
| Working Example 12 | HB-TmDA40VF2 | nitrogen atmosphere | 116 | 109 | 122 | 128 | 148 |
| Working Example 13 | HB-TmDA40VF3 | open air | 88 | 101 | 127 | 190 | 231 |
| Working Example 14 | HB-TmDA40VF3 | nitrogen atmosphere | 92 | 113 | 128 | 179 | 188 |
| Comparative Example 1 | — | — | 105 | 125 | >1,000 | >1,000 | >1,000 |

A decrease in the electrical conductivity of the transparent conductive film strongly affects device performance. It was apparent from the above results that the protective films of the invention had the effect of improving the visibility of the transparent conductive film and also suppressing deterioration of the transparent conductive film. In Working Example 12 in particular, the percent change in resistance was found to be small.

Production Example 4

A 20 wt % solution (referred to below as "HB-TmDAVP1") was prepared by dissolving 100 g of the HB-TmDA40 polymer prepared in Synthesis Example 1 in a mixed solvent of 384.0 g of cyclopentanone and 16.0 g of deionized water.

Working Example 15

Preparation 4 of Protective Film-Forming Composition

A varnish (referred to below as "HB-TmDA40VPF1") having a total solids concentration of 2 wt % was prepared by adding together 0.08 g of the HB-TmDA40VP1 solution prepared in Production Example 4, 0.78 g of a 10 wt % cyclopentanone/deionized water (96/4) mixed solution of DN0075 (3,000 to 5,000 mPa·s; from Nippon Kayaku Co., Ltd.), 0.033 g of a 10 wt % cyclopentanone/deionized water (96/4) mixed solution of ethoxylated pentaerythritol tetraacrylate (ATM-35E, 350 mPa·s; molecular weight, 1,892; from Shin-Nakamura Chemical Co., Ltd.), 0.06 g of a 5 wt % cyclohexanone solution of the photoradical initiator Irgacure 127 (BASF), 0.002 g of a 1 wt % cyclohexanone solution of the surfactant Megafac R-40 (DIC Corporation), 0.16 g of deionized water and 3.88 g of cyclohexanone, and then visually checking that dissolution had occurred.

Working Example 16

Measurement of Refractive Index of Applied Film

Using a spin coater, the HB-TmDA40VPF1 varnish prepared in Working Example 15 was spin-coated onto a soda-lime glass substrate at 200 rpm for 5 seconds and at 1,500 rpm for 30 seconds, and an oven was used to carry out a 3-minute bake at 120° C. The applied varnish was then cured with a high-pressure mercury vapor lamp under nitrogen and at a cumulative exposure dose of 400 mJ/cm$^2$, giving a cured film having a thickness of 57 nm. The resulting film had a refractive index of 1.5683 (wavelength, 550 nm).

Working Example 17

Using a spin coater, the HB-TmDA40VPF1 varnish prepared in Working Example 15 was spin-coated at 200 rpm for 5 seconds and at 1,500 rpm for 30 seconds onto the transparent conductive film produced in Production Example 3, and an oven was used to carry out a 3-minute bake at 120° C. The applied varnish was then cured with a high-pressure mercury vapor lamp in a nitrogen atmosphere and at a cumulative exposure dose of 400 mJ/cm$^2$, giving a cured film having a thickness of 80 nm. The haze value of the resulting film was measured and found to be 0.74%.

Working Example 18

The sample obtained in Working Example 17 was placed in a test chamber set to an internal temperature of 85° C. and a relative humidity of 85% and held under those conditions for 168 and 500 hours, following which the change in sheet resistance was measured. Those results are shown in Table 5. In Table 5, "0 h" indicates the sheet resistance immediately after sample production.

TABLE 5

| | Varnish | Exposure environment | Sheet resistance (Ω/□) after elapsed times shown below | | |
|---|---|---|---|---|---|
| | | | 0 h | 168 h | 500 h |
| Working Example 18 | HB-TmDA40VPF1 | in nitrogen | 92 | 95 | 127 |

The invention claimed is:

1. A film-forming composition for use on a transparent conductive film, the composition consisting of:
a triazine ring-containing hyperbranched polymer which includes a recurring unit structure of formula (1) below

[Chemical Formula 1]

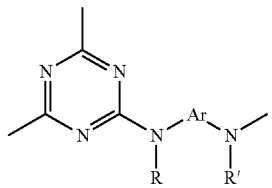
(1)

(wherein R and R' are each independently a hydrogen atom, an alkyl group, an alkoxy group, an aryl group or an aralkyl group; and Ar is at least one moiety selected from the group consisting of moieties of formulas (2) to (13) below

[Chemical Formula 2]

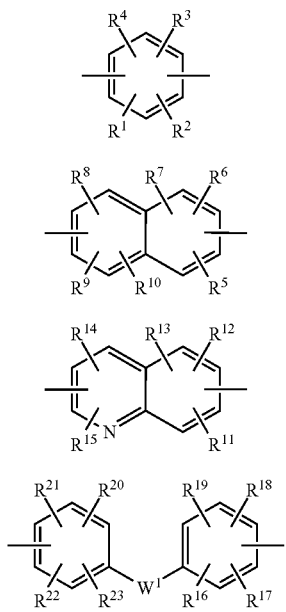

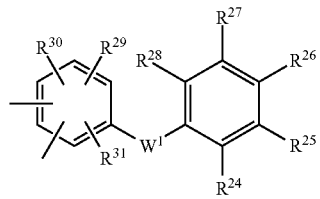

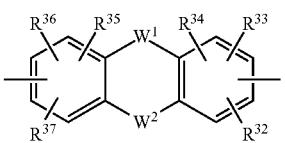

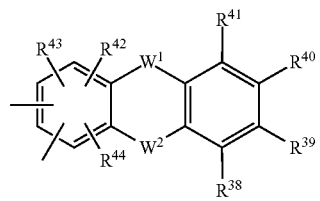

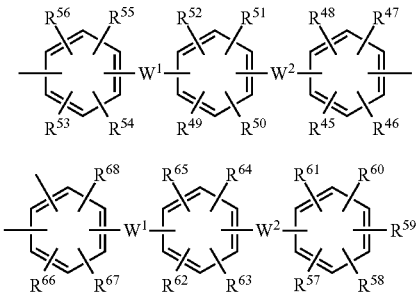

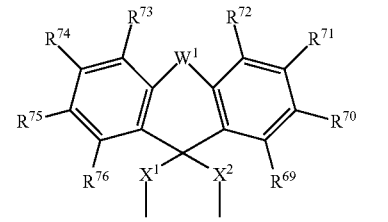

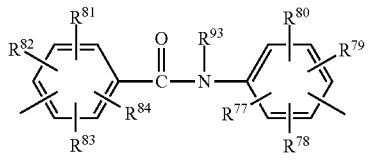

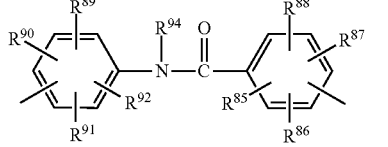

(in which R' to $R^{92}$ are each independently a hydrogen atom, a halogen atom, a carboxyl group, a sulfo group, an alkyl group of 1 to 10 carbon atoms, or an alkoxy group of 1 to 10 carbon atoms;

$R^{93}$ and $R^{94}$ are hydrogen atoms or alkyl groups of 1 to 10 carbon atoms;

$W^1$ and $W^2$ are each independently a single bond, —C($R^{95}$)($R^{96}$)— ($R^{95}$ and $R^{96}$ being each independently a hydrogen atom or an alkyl group of 1 to 10 carbon atoms, with the proviso that when $R^{95}$ and $R^{96}$ are both alkyl groups, optionally they form a ring together with the carbon atom to which they are bonded), —C(O)—, —O—, —S—, —S(O)—, —S(O)$_2$— or —N(R)$^{97}$— ($R^{97}$ being a hydrogen atom or an alkyl group of 1 to 10 carbon atoms); and $X^1$ and $X^2$ are each independently a single bond, an alkylene group of 1 to 10 carbon atoms, or a group of formula (14) below

[Chemical Formula 3]

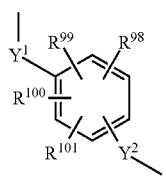

(14)

($R^{98}$ to $R^{191}$ being each independently a hydrogen atom, a halogen atom, a carboxyl group, a sulfo group, an alkyl group of 1 to 10 carbon atoms, or an alkoxy group of 1 to 10 carbon atoms; and $Y^1$ and $Y^2$ being each independently a single bond or an alkylene group of 1 to 10 carbon atoms)));

a crosslinking agent A having a molecular weight of at least 1,000; and a crosslinking agent B having a molecular weight of less than 1,000, and optionally at least one selected from the group consisting of a solvent, an initiator, leveling agents and surfactants, wherein molecular weight is a weight-average molecular weight.

2. The composition of claim 1, wherein crosslinking agent A is a poly(meth)acrylic compound.

3. The composition of claim 1 or 2 which includes from 0.1 to 30 parts by weight of crosslinking agent A per 100 parts by weight of the triazine ring-containing hyperbranched polymer.

4. The composition of claim 1, wherein crosslinking agent B is a poly(meth)acrylic compound.

5. The composition of claim 1 which includes from 0.5 to 400 parts by weight of crosslinking agent B per 100 parts by weight of crosslinking agent A.

6. A protective film for use on a transparent conductive film, which protective film is obtained by curing the composition of claim 1.

7. The protective film of claim 6, wherein the transparent conductive film is a transparent conductive film having electrically conductive nanostructures.

8. The protective film of claim 7, wherein the electrically conductive nanostructures are made of silver nanowire.

9. A transparent electrode comprising a transparent conductive film and the protective film of claim 6 formed on the transparent conductive film.

10. An electronic device comprising a transparent conductive film and the protective film of claim 6 formed on the transparent conductive film.

11. The electronic device of claim 10 which is an organic electroluminescence display.

* * * * *